United States Patent
Engh-Halstvedt et al.

(10) Patent No.: US 9,933,999 B2
(45) Date of Patent: Apr. 3, 2018

(54) APPARATUS, METHOD AND PROGRAM FOR CALCULATING THE RESULT OF A REPEATING ITERATIVE SUM

(71) Applicant: ARM Limited, Cambridge (GB)

(72) Inventors: Andreas Due Engh-Halstvedt, Trondheim (NO); Edvard Fielding, Trondheim (NO)

(73) Assignee: ARM Limited, Cambridge (GB)

( * ) Notice: Subject to any disclaimer, the term of this patent is extended or adjusted under 35 U.S.C. 154(b) by 239 days.

(21) Appl. No.: 14/878,562

(22) Filed: Oct. 8, 2015

(65) Prior Publication Data

US 2016/0124708 A1    May 5, 2016

(30) Foreign Application Priority Data

Oct. 31, 2014  (GB) .................................. 1419456.7

(51) Int. Cl.
| | |
|---|---|
| *G06F 7/00* | (2006.01) |
| *G06F 7/506* | (2006.01) |
| *G06F 7/527* | (2006.01) |
| *G06F 7/535* | (2006.01) |
| *H03M 7/24* | (2006.01) |

(52) U.S. Cl.
CPC ............ *G06F 7/506* (2013.01); *G06F 7/5272* (2013.01); *G06F 7/535* (2013.01); *H03M 7/24* (2013.01)

(58) Field of Classification Search
CPC ........ G06F 7/506; G06F 7/5272; G06F 7/535; H03M 7/24
See application file for complete search history.

(56) References Cited

U.S. PATENT DOCUMENTS

| | | |
|---|---|---|
| 5,243,552 A | 9/1993 | Asakura |
| 7,257,609 B1 | 8/2007 | Kosunen et al. |
| 2006/0095496 A1 | 5/2006 | Fay |

OTHER PUBLICATIONS

Search Report for GB 1419456.7, dated May 1, 2015, 3 pages.
Li, "Fast Constant Division Routines", IEEE, vol. c-34, No. 9, Sep. 1985, pp. 866-869.
Drane et al., "Correctly Rounded Constant Integer Division via Multiply-Add", Imagination Technologies Ltd., Circuits and Systems (ISCAS), 2012 IEEE International Symposium, May 20-23, 2012, 4 pages.

(Continued)

*Primary Examiner* — Tan V. Mai
(74) *Attorney, Agent, or Firm* — Nixon & Vanderhye P.C.

(57) ABSTRACT

An apparatus, method and program are provided for calculating a result value to a required precision of a repeating iterative sum, wherein the repeating iterative sum comprises multiple iterations of an addition using an input value. Addition is performed in a single iteration of addition as a sum operation using overlapping portions of the input value and a shifted version of the input value, wherein the shifted version of the input value has a partial overlap with the input value. At least one result portion is produced by incrementing an input derived from the input value using the output from the sum operation and the result value is constructed using the at least one result portion to give the result value to the required precision. The repeating iterative sum is thereby flattened into a flattened calculation which requires only a single iteration of addition using the input value, thus facilitating the calculation of the result value of the repeating iterative sum.

26 Claims, 15 Drawing Sheets

(56) References Cited

OTHER PUBLICATIONS

Schwartzbacher et al., "Constant Divider Structures of the Form $2^n\pm1$", Reprint of Irish Signals and Systems Conference 2000, Jun. 2000, pp. 368-375.
Dinechin et al., "Table-Based Division by Small Integer Constants", Applied Reconfigurable Computing, Mar. 2012, pp. 53-63.
"Integer Division by Constants", 10-17 Methods Not Using Multiply High, Hackers Delight, Chapter 10, Dec. 30, 2003, 28 pages.
Granlund et al., "Division by Invariant Integers using Multiplication", Proceedings of the SIGNPLAN '94 Conference on Programming Language Design and Implementation, Aug. 1994, 12 pages.
Alverson, "Integer Division using Reciprocals", Proceedings of the Tenth Symposium on Computer Arithmetic, Jun. 1991, 5 pages.

```
 iiiiiiiiffffffff                                           20
+        iiiiiiiiffffffff
+                iiiiiiiiffffffff
+                        <repeat>
```

```
d = i + f                                                   22
c = generate (i + f)
```

```
 iiiiiiii                                                   24
+       cdddddddd
+               cdddddddd
+                       <repeat>
```

```
I = i + generate(i+f)                                       26
D = d + generate(i+f)
```

```
IIIIIIII DDDDDDDD DDDDDDDD DDDDDDDD <repeat>                28
```

FIG. 2

```
iiiiiiiiiiffffffff
+        iiiiiiiiiiffffffff
+                iiiiiiiiiiffffffff
+                        <repeat>
```
40

```
aaaaaaaabbffffffff
+        aaaaaaaabbffffffff
+                aaaaaaaabbffffffff
+                        <repeat>
```
42

```
d = a + f
c = generate (a + f)
```
44

```
aaaaaaaabb
+        cdddddddbb
+                cdddddddd
+                        <repeat>
```
46

```
A = a + ( generate(a+f) && propagate(b) )
B = b +   generate(a+f)
D = d + ( generate(a+f) && propagate(b) )
```
48

```
AAAAAAAABB DDDDDDDDBB DDDDDDDDBB DDDDDDDDBB <repeat>
```
50

FIG. 4

```
iiiiiiffffffff
+     iiiiiiffffffff
+           iiiiiiffffffff
+                 <repeat>
```
— 120

```
iiiiiiaabbbbcc
+     iiiiiiaabbbbcc
+           iiiiiiaabbbbcc
+                 <repeat>
```
— 122

```
d = a+c
A = a + ( generate(a+c) && propagate(b) )
B = b +   generate(a+c)
D = d + ( generate(a+c) && propagate(b) )
G = generate(a+c) && propagate(b) && propagate(a)
```
— 124

```
iiiiiiAABBBB
+     GiiiiiiDDBBBB
+           iiiiiiDDBBBB
+                 <repeat>
```
— 126

```
e = i + AB
j = i + DB
E = e + generate(i + DB)
F = j + generate(i + DB)
I = i + ( G || generate(i + AB) ||
        ( generate(i + DB) && propagate(i + AB) ) )
```
— 128

```
IIIIII EEEEEE FFFFFF FFFFFF FFFFFF <repeat>
```
— 130

FIG. 9

```
  iiiffffffff
+    iiiffffffff
+       iiiffffffff
+          iiiffffffff
                ...
```

APPARATUS, METHOD AND PROGRAM FOR CALCULATING THE RESULT OF A REPEATING ITERATIVE SUM

This application claims priority to GB Patent Application No. 1419456.7 filed 31 Oct. 2014, the entire content of which is hereby incorporated by reference.

TECHNICAL FIELD

The present disclosure relates to data processing. More particularly it relates to calculating the result of a repeating iterative sum when data processing.

BACKGROUND

When data processing, it may be required to perform a division by a small non-power-of-two constant. Such division operations are commonly required in graphics processing. This may for example be the case when working with normalized numbers. An unsigned normalized number, sometimes referred to as unorm<n>, has a value in the range [0, 1] and the numerical value of a bit pattern x is $$\frac{x}{2^n - 1}.$$

For example for an unorm6, the formula is $$\frac{x}{63}.$$

The division by a small non-power-of-two constant may be required when multiplying two normalized values, or when converting to floating point or fixed-point values. One way to perform such a division is to multiply by $$\frac{1}{2^n - 1},$$

yet this multiplication is rather expensive, for example in terms of the area of the apparatus which needs to be provided to support such a multiplication.

All numbers of the form $$\frac{1}{2^n - 1}$$

have a binary expansion of the form $0.\overline{000001}$, where the bar represents an infinitely repeating bit pattern and this example expansion is given for n=6. The size of the repeating pattern is always n bits. It is then possible to change the multiplication into a sequence of additions and shifts, becoming the sum $\Sigma_{a=1}^{\infty} x*2^{-an}$. The sum is infinite, but clearly can be truncated to only evaluate as many iterations as are required for the target number format.

Nevertheless, there remains some complexity and expense associated with evaluating the result of the sum, which it would be desirable to reduce.

SUMMARY

Viewed from a first aspect, apparatus is provided for calculating a result value to a required precision of a repeating iterative sum, wherein the repeating iterative sum comprises multiple iterations of an addition using an input value, wherein the apparatus comprises: an adder capable of performing a single iteration of addition as a sum operation using overlapping portions of the input value and a shifted version of the input value, wherein the shifted version of the input value has a partial overlap with the input value; at least one incrementer capable of producing at least one result portion derived from the input value using output from the sum operation performed by the adder; and a result generator capable of constructing the result value using the at least one result portion to give the result value to the required precision.

Viewed from a second aspect a method is provided of calculating a result value to a required precision of a repeating iterative sum in a data processing apparatus, wherein the repeating iterative sum comprises multiple iterations of an addition using an input value, wherein the method comprises the steps, implemented by the data processing apparatus, of: performing a single iteration of addition as a sum operation using overlapping portions of the input value and the shifted version of the input value, wherein the shifted version of the input value has a partial overlap with the input value; producing by incrementation at least one result portion derived from the input value using output from the sum operation; and constructing the result value using the at least one result portion to give the result value to the required precision.

Viewed from a third aspect, apparatus is provided for calculating a result value to a required precision of a repeating iterative sum, wherein the repeating iterative sum comprises multiple iterations of an addition using an input value, wherein the apparatus comprises: means for performing a single iteration of addition as a sum operation using overlapping portions of the input value and the shifted version of the input value; means for producing at least one result portion derived from the input value using output from the sum operation performed by the adder; and means for constructing the result value using the at least one result portion to give the result value to the required precision.

BRIEF DESCRIPTION OF THE DRAWINGS

The present invention will be described further, by way of example only, with reference to embodiments thereof as illustrated in the accompanying drawings, in which:

FIG. 2 shows a repeating iterative sum having an exact overlap between the integer and fractional portions of an input value, and the stages implemented by one embodiment to determine the result of the repeating iterative sum to a required precision;

FIG. 4 shows a repeating iterative sum having non-overlapping portion between the integer and fractional portions of an input value, and the stages implemented by one embodiment to determine the result of the repeating iterative sum to a required precision;

FIG. 9 shows a repeating iterative sum having a double overlap between the integer and fractional portions of an input value, and the stages implemented by one embodiment to determine the result of the repeating iterative sum to a required precision;

DESCRIPTION OF EMBODIMENTS

Figure 1:
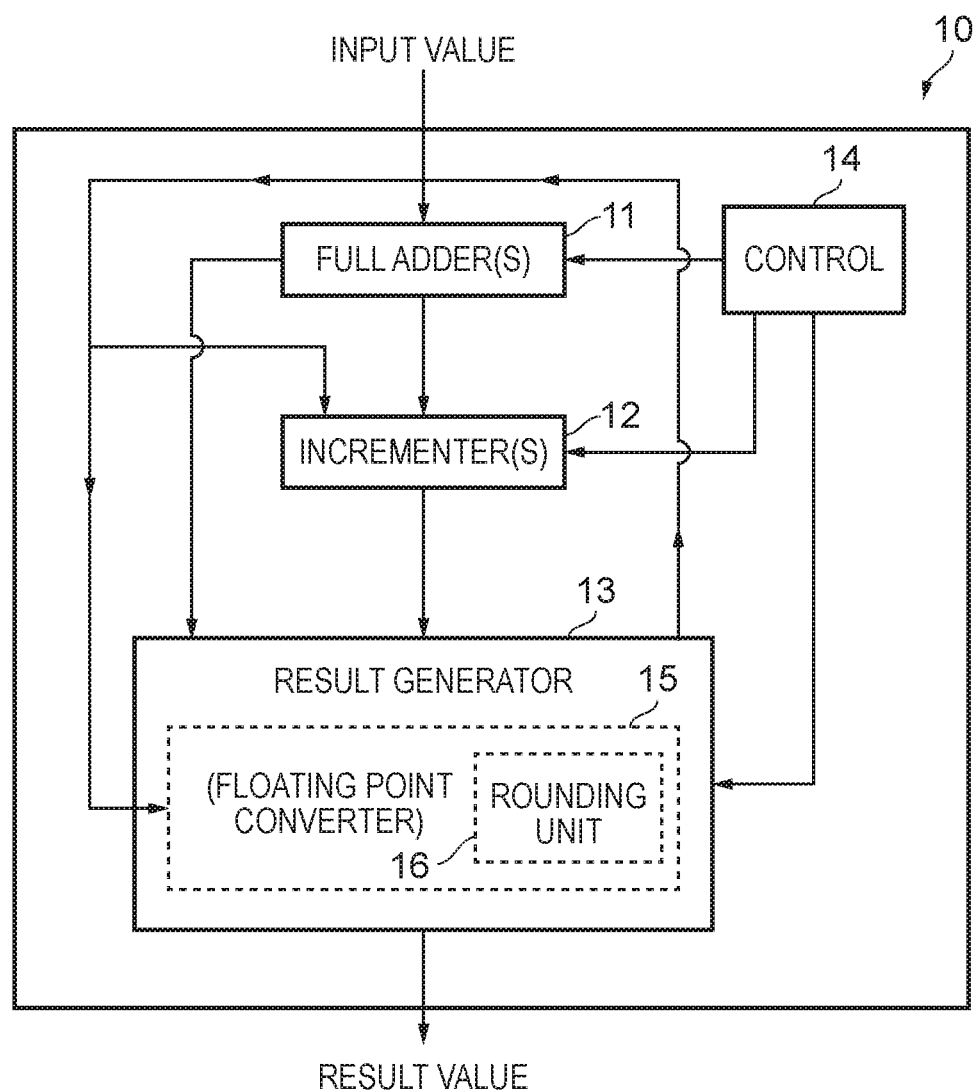
FIG. 1 schematically illustrates an apparatus in one embodiment.

The present techniques facilitate the calculation of the result value of the repeating iterative sum by "flattening" the repeating iterative sum into a flattened calculation which requires only a single iteration of addition using the input value. In an apparatus for implementing the present techniques therefore only one full adder need be provided, despite the repeating iterative sum comprising multiple additions, which facilitates a compact implementation of the apparatus. It should be noted that although the example of a binary expansion of the form 0.$\overline{000001}$ is mentioned above, the present techniques are not only applicable to this particular pattern, but may equally be applied to any division where the inverse has a (sparsely) repeating binary expansion. The sparseness of the repeating binary expansion reduces the complexity of the corresponding repeating iterative sum and hence the complexity of the stages involved in the present techniques.

In some embodiments a first iteration of the addition comprises addition of the input value to the shifted version of the input value, and each further iteration of the addition comprises addition of a previous iteration addition result to a further shifted version of the input value, wherein the further shifted version of the input value has the partial overlap with the previous iteration addition result. In other words, each of the multiple iterations of the repeating iterative sum may comprise the addition of the input value with itself, but wherein the next instance of the input value is shifted with respect to the previous instance of the input value. The shift of the next instance of the input value with respect to the previous instance of the input value gives the partial overlap between the next instance of the input value and the previous instance of the input value.

In some embodiments the adder is capable of performing the sum operation to produce a sum value; the at least one incrementer comprises: a first incrementer capable of producing a first result portion, wherein producing the first result portion comprises incrementing a most significant portion of the input value which has the partial overlap with the shifted version of the input value using a carry result of the sum operation; and a second incrementer capable of producing a second result portion, wherein producing the second result portion comprises incrementing the sum value using the carry result of the sum operation; and the result generator is capable of constructing the result value as the first result portion followed by at least one second result portion to give the result value to the required precision.

In some embodiments an intermediate portion of the input value has no overlap with the shifted version of the input value, wherein the first incrementer is capable of producing the first result portion as the most significant portion of the input value which has the partial overlap incremented by an increment value, wherein the increment value is given by the carry result of the sum operation ANDed with a propagate value, wherein the propagate value indicates whether the intermediate portion will carry-propagate in the addition, the second incrementer is capable of producing the second result portion as the sum value incremented by the increment value, and the result generator is capable of constructing the result value in which both the first result portion and the second result portion are suffixed by the third result portion.

In some embodiments the apparatus further comprises: a third incrementer capable of producing a third result portion, wherein producing the third result portion comprises incrementing the intermediate portion by the carry result of the sum operation.

In some embodiments an intermediate portion of the input value has no overlap with the shifted version of the input value, and: the adder is capable of performing the sum operation to produce a sum value; the at least one incrementer comprises: a first incrementer capable of producing a first result portion, wherein producing the first result portion comprises suffixing a most significant portion of the input value which has the partial overlap with the intermediate portion of the input value to give an first result portion input value, and incrementing the first result portion input value with a carry result of the sum operation; and a second incrementer capable of producing a second result portion, wherein producing the second result portion comprises incrementing the sum value using the carry result of the sum operation; and the result generator is capable of constructing the result value as the first result portion followed by at least one second result portion to give the result value to the required precision, wherein the at least second one result portion is suffixed by a least significant portion of the first result value having a same size as the intermediate portion of the input value.

In some embodiments the apparatus further comprises: a floating point converter capable of converting the result value into a floating point format value.

In some embodiments the input value comprises an integer portion and a fraction portion.

In some embodiments the floating point converter comprises: a first bit position generator capable of receiving the integer portion of the input value and outputting a most significant bit position as a first bit position output value; a second bit position generator capable of outputting a most significant bit position of the integer portion of the input value incremented by one as a second bit position output value; and a third bit position generator capable of generating a position of a most significant bit in the fraction portion of the input value as a third bit position output value, wherein the floating point converter is capable of generating an exponent portion of the floating point format value using the first bit position output value when the integer portion is non-zero and the carry result is zero, using the second bit position output value when the integer portion is non-zero and the carry result is non-zero, and using the third bit position output value when the integer portion is zero.

In some embodiments the second bit position generator is capable of determining whether the integer portion of the input value comprises a one immediately followed by a zero, and if it does providing the first bit position output value as the second bit position output value, and if it doesn't incrementing the first bit position output value by one to generate the second bit position output value.

In some embodiments the first bit position generator, the second bit position generator, and the third bit position generator are capable of parallel operation.

In some embodiments the partial overlap comprises a double self-overlap of the input value in the repeating iterative sum, the double self-overlap comprising addition of a least significant portion of the input value, an intermediate significance portion of the input value and a most significant portion of the input value in a first iteration of the repeating iterative sum, and the apparatus is capable of performing a pre-flattening operation of removing the double self-overlap for the input value in the repeating iterative sum comprising determining a replacement input value for the input value.

In some embodiments the input value comprises an integer portion and a fraction portion, wherein the intermediate significance portion of the input value is a most significant portion of the fraction portion, wherein the least significant portion of the input value is a least significant portion of the fraction portion, wherein an intermediate significance portion of the fraction portion is not comprised in the double self-overlap, and wherein the apparatus comprises: a pre-flatten adder capable of performing a pre-flatten sum operation on the most significant portion of the fraction portion and the least significant portion of the fraction portion to produce a pre-flattened sum value; a first pre-flatten incrementer capable of producing a first pre-flatten portion by incrementing the most significant portion of the fraction portion by a pre-flatten increment value, wherein the pre-flatten increment value is given by a carry result of the pre-flatten sum operation ANDed with a pre-flatten propagate value, wherein the pre-flatten propagate value indicates if the intermediate significance portion of the fraction portion will carry-propagate in the addition, a second pre-flatten incrementer capable of producing a second pre-flatten portion as the intermediate significance portion of the fraction portion incremented by the carry result of the pre-flatten sum operation; a third pre-flatten incrementer capable of producing a third pre-flatten result portion as the pre-flattened sum value incremented by the pre-flatten increment value; and a pre-flatten generate value generator capable of producing a pre-flatten generate value as the pre-flatten increment value ANDed with an indication of whether the most significant portion of the fraction portion will carry-propagate in the addition, and the apparatus is capable of constructing the replacement input value in a first iteration of the repeating iterative sum by replacing the fraction portion with the first pre-flatten portion suffixed by the second pre-flatten portion, and in a second iteration of the repeating iterative sum by replacing the fraction portion with the third pre-flatten portion suffixed by the second pre-flatten portion and prepending by the pre-flatten generate value, and in third and further iterations of the repeating iterative sum by replacing the fraction portion with the third pre-flatten portion suffixed by second pre-flatten portion.

In some embodiments the apparatus comprises: a first adder capable of performing a first sum operation on the integer portion and the first pre-flatten portion suffixed by the second pre-flatten portion to produce a first sum value; a second adder capable of performing a second sum operation on the integer portion and the third pre-flatten portion suffixed by the second pre-flatten portion to produce a second sum value; a first incrementer capable of generating a first result portion by incrementing the first sum value by a carry result of the second sum operation; a second incrementer capable of generating a second result portion by incrementing the second sum value by the carry result of the second sum operation; and a third incrementer capable of generating a third result portion by incrementing the integer portion by a further pre-flatten increment value.

In some embodiments the further pre-flatten increment value is given by the pre-flatten generate value ORed with the carry result of the first sum operation ORed with an increment contribution value, wherein the increment contribution value is given by the carry result of the second sum operation ANDed with a propagate value which indicates if the first sum value will carry-propagate in the addition, and the result generator is capable of constructing the result value as the third result portion followed the first result value portion followed by at least one second result portion to give the result value to the required precision.

In some embodiments the further pre-flatten increment value is given by the pre-flatten generate value added to the carry result of the first sum operation added to an increment contribution value, wherein the increment contribution value is given by the carry result of the second sum operation ANDed with a propagate value which indicates if the first sum value will carry-propagate in the addition, and the result generator is capable of constructing the result value as the third result portion followed the first result value portion followed by at least one second result portion to give the result value to the required precision.

In some embodiments, when the most significant portion of the fraction portion is non-zero, the third bit position generator is capable of generating the position of the most significant bit in the fraction portion of the input value as the third bit position output value using a replacement fraction portion, the replacement fraction portion comprising: the first pre-flatten portion suffixed by the second pre-flatten portion, suffixed by at least one instance of the third pre-flatten portion suffixed by the second pre-flatten portion.

In some embodiments, when the most significant portion of the fraction portion is zero, the third bit position generator is capable of generating the position of the most significant bit in the fraction portion of the input value as the third bit position output value using a replacement fraction portion, the replacement fraction portion comprising: the intermediate significance portion of the fraction portion suffixed by the least significant portion of the fraction portion.

In some embodiments the partial overlap comprises at least a triple self-overlap of the input value in the repeating iterative sum, the triple self-overlap comprising the double self-overlap and at least one further self-overlap of the input value in the repeating iterative sum, the triple self-overlap corresponding to addition of three incrementally shifted versions of the input value to the input value at the first iteration of the repeating iterative sum, and the apparatus is capable of performing at least one further pre-flattening operation of removing the at least one further self-overlap of the input value in the repeating iterative sum comprising determining a prior replacement input value for the replacement input value.

In some embodiments the apparatus is capable of performing a further pre-flattening operation in parallel with the pre-flattening operation.

In some embodiments the input value represents a normalised number having a minimum absolute value of zero and a maximum absolute value of one.

In some embodiments the input value has an integer component and a fraction component, and wherein to represent the maximum absolute value of the normalised number the integer component is a continuous sequence of a first type of bit value and the fraction component is a continuous sequence of a second type of bit value, wherein the second type is complementary to the first type.

In some embodiments the repeating iterative sum implements multiplication by a reciprocal of a non-power-of-two constant.

In some embodiments the non-power-of-two constant is expressible as an integer power-of-two minus one.

In some embodiments the apparatus is capable of performing a rounding operation on the result value comprising addition of half of a last place unit to the result value.

Some embodiments provide a computer-readable storage medium on which a computer program is stored in a non-transient fashion, the computer program for controlling a computer to carry out the method of the above-recited second aspect.

FIG. 1 schematically illustrates a data processing apparatus 10 in one embodiment. From the components of this data processing apparatus 10, it will be recognised that the components illustrated in FIG. 1 will typically represent only part of a larger data processing apparatus, which may for example be a general purpose data processing device (e.g. a central processing unit or a graphics processing unit). The data processing apparatus 10 is capable of calculating (i.e. has a configuration which enables it to calculate) a result value of a repeating iterative sum, on the basis of an input value to that repeating iterative sum, wherein the input value is added to a running total at each iteration of the repeating iterative sum (although right shifted at each iteration with respect to the previous iteration). Specific examples of such repeating iterative sums are given with respect to the figures which follow. Note that the following example configurations of the data processing apparatus are discussed in terms of unsigned normalized numbers, although signed normalized numbers may also be handled, for example by converting the input to sign-magnitude representation first, then sending the magnitude through the unsigned path, and finally restoring the sign bit (not illustrated). Equally, non-normalized numbers may also be handled—there is no need for the input value to be in a normalized format. One feature (the use of which is shown later) however which has been identified of using a normalized input value is that the summation (ADD) of multiple carries in the iterative sum can be replaced by an OR operation, based on the knowledge that only one carry can be set for a normalized number.

Data processing apparatus 10 comprises at least one adder 11, at least one incrementer 12 and a result generator 13. These components operate under the general control of a control unit 14. The result generator 13 may (note the dashed boundary) further comprise a floating point converter 15 which is configured to convert the result value into a floating point format result. The floating point converter 15 may (note the dashed boundary) itself further comprise a rounding unit 16, to perform a rounding operation on the result value generated by the result generator.

FIG. 2 shows one example of the format an input value which may be received by the data processing apparatus 10 of FIG. 1, and the structure of the repeating iterative sum required to be performed to divide this example input by a constant value, which in this example is $(2^8-1)$ 255. The structure of the repeating iterative sum is shown in box 20 in FIG. 2. Note that the input value (iiiiiiiifffffff) in this example is an unorm8.8, i.e. an 8-bit unsigned normalised number with 8 fractional bits. The iterative sum shown at 20 in FIG. 2 corresponds to the division of this input value by 255 even though the input value has more than 8 bits. Note further that the maximum value of this unsigned normalised number (i.e. 1.0) is represented by the bit pattern "11111111.00000000" (i.e. not "11111111.11111111") in the representation used here. The integer portion of the input value is represented by the letters i in box 20, and the fractional part by the letters f. Note still further that the overlap between the integer part of the input value and its fractional part in the repeating iterative sum is exact in this example, in that the integer part of a next iteration of the sum aligns exactly with the fractional part of a previous iteration of the sum. There is also only a single level of overlap in this sum, i.e. there are never any places where more than two bits must be added to one another.

Box 22 shows two calculations which the present techniques apply to the repeating iterative sum shown in box 20 in order to implement the calculation of the repeating iterative sum as a flattened calculation in which only a single iteration of addition using the input value is required. Specifically, in the example of FIG. 2, the single iteration of addition using the input value is the calculation of d=i+f shown in box 22. The carry out value of this sum (c) is also determined. Substituting d and c into the expression of box 20 gives the expression of box 24. An important feature to note of the expression shown in box 20 is that when considering propagation and generation for the sum i+f, these can either generate or propagate a carry, but never both. Recall that generate(x+y)=x AND y, whilst propagate (x+y)=x XOR y. This is of significance here, since a generated carry from the sum i+f is the only carry that exists in the infinite repeating iterative sum. Either sum(i+f) generates a carry or there is no carry in the entire expression. This means that the carry from one repetition of the sum can propagate into, but not through, the next iteration. Therefore, the sum only needs to be performed once and the result can be used as many times as required for the correct format of the result value. Thus, substituting c and d from box 20 into the expression of box 22 gives the expression shown in box 24. In terms of the expression in box 24 this can thus be substituted for by the expressions shown in box 26, where I is the value of i incremented by the carry value for the i+f sum and D is the value of the d also incremented by the carry value from the i+f sum. Performing these substitutions gives the expression shown in box 28 (where it is the D term which infinitely repeats). The expression shown in box 28 is thus a flattened calculation which implements the repeating iterative sum shown in box 20, wherein (as may be seen from the substitutions of box 22 and 26) there is only one iteration of addition required to be performed (namely d=i+f). The data processing apparatus evaluates the expression of box 28 to the required precision for the result, i.e. truncating the expression at the point at which such required precision in the result value is achieved. A rounding of the result value may also be performed (by the rounding unit 16 in the result generator 13) by adding half of a last place unit to the result value. Note that it is in the nature of the infinite repeating sum that this rounding can never have a tie, since if the bits immediately below the rounding point were "10" as required to hit the tie case, then the infinitely repeating pattern ensures that there must also be further "10"s further downs the iterative sum, and so a tie can never occur.

Figure 3:
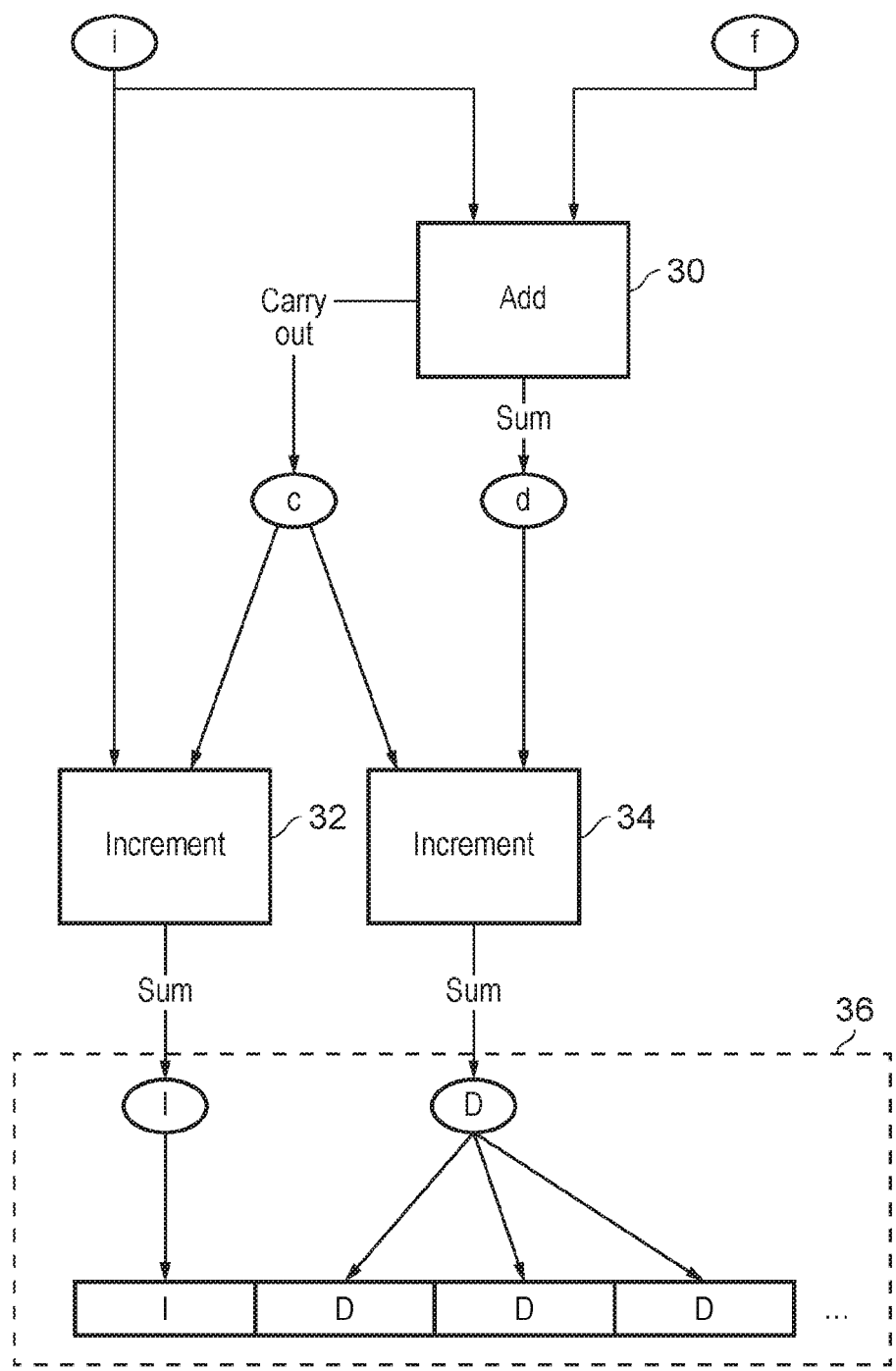
FIG. 3 schematically illustrates components and interconnections of an apparatus in one embodiment which implements the stages shown in FIG. 2.

FIG. 3 schematically illustrates a configuration of the data processing apparatus 10 to implement the stages discussed with respect to FIG. 2. Note that an abbreviated notation is used here, where "i" in FIG. 3 corresponds to the integer portion mum in FIG. 2 and "f" in FIG. 3 corresponds to the fractional portion ffffffff in FIG. 2. Similarly "I" and "D" in FIG. 3 respectively correspond to IIIIIIII and DDDDDDDD in FIG. 2. The integer (i) and fractional (f) portions of the input value are received by the (full) adder 30 which produces the sum value (d) and the carry out result (c), and has a width equal to the size of the overlap (8 bits in this example). A first incrementer 32 receives the integer portion (i) and the carry out result (c) and increments the integer portion (i) by the carry out result (c) to generate the sum value I—the integer portion of the result value. A second incrementer 32 receives the sum value (d) and the carry out result (c) and increments the sum value (d) by the carry out result (c) to generate the sum value D—at least one fractional portion of the result value. The first incrementer 32 and second incrementer 34 have the same width as the adder 30 (i.e. 8 bits in this example). I and D are arranged into the result value by the result generator 36.

FIG. 4 shows another example of the format an input value which may be received by the data processing apparatus 10 of FIG. 1, and the structure of the repeating iterative sum required to be performed to divide this example input by a constant value, which in this example is $(2^{10}-1)$ 1023. The structure of the repeating iterative sum is shown in box 40 in FIG. 4. Note that in this example the input value (iiiiiiiiffffffff) in this example is unorm10.8, i.e. an 10-bit unsigned normalised number with 8 fractional bits, where once more the i's represent the integer portion of the input value and the f's represent the fractional part. Comparing this example to that in FIG. 2, note that the overlap between the integer part of the input value and its fractional part in the repeating iterative sum is not exact in this example, in that there is a portion of the integer part of a next iteration of the sum which does not overlap with any part of the fractional part of a previous iteration of the sum. Nevertheless there is also only a single level of overlap in this sum, i.e. there are never any places where more than two bits must be added to one another.

To distinguish between the overlapping and non-overlapping parts of the integer part, the terms a (for the overlapping part) and b (for the non-overlapping part) are substituted, as shown in box 42. Once more there are two calculations which the present techniques apply to the repeating iterative sum shown in boxes 40 and 42 in order to implement the calculation of the repeating iterative sum as a flattened calculation in which only a single iteration of addition using the input value is required, namely those shown in box 44. In the example of FIG. 4, the single iteration of addition using the input value is the calculation of d=a+f shown in box 44. Again, the carry out value of this sum (c) is also determined. Now substituting d and c into the expression of box 42 gives the expression of box 46. Once more, when considering propagation and generation for the sum a+f, these can either generate or propagate a carry, but never both, so here also the sum only needs to be performed once and the result can be used as many times as required for the correct format of the result value. Thus, substituting c and d from box 44 into the expression of box 42 gives the expression shown in box 46.

Box 48 shows the three incrementing calculations which are performed in this example. An incrementing term is generated as (generate (a+f) && propagate (b)), i.e. (c && propagate(b)), and this is used to increment each of a (the overlapping portion of the integer part of the input value) and d (the overlapping portion of the integer part of the input value) to give A and D respectively. The non-overlapping portion of the integer part of the input value (b) is incremented by generate (a+f), i.e. c.

The expression in box 46 this can thus be substituted for by the expressions shown in box 48, to give the expression shown in box 50 (where it is the DB term which infinitely repeats). The expression shown in box 50 is thus a flattened calculation which implements the repeating iterative sum shown in box 40, wherein (as before in the FIG. 2 example) there is only one iteration of addition required to be performed (namely d=a+f). As in the example of FIG. 2, the data processing apparatus evaluates the expression of box 50 to the required precision for the result, i.e. truncating the expression at the point at which such required precision in the result value is achieved. A rounding of the result value may also be performed by the rounding unit 16 in the result generator 13.

Figure 5:
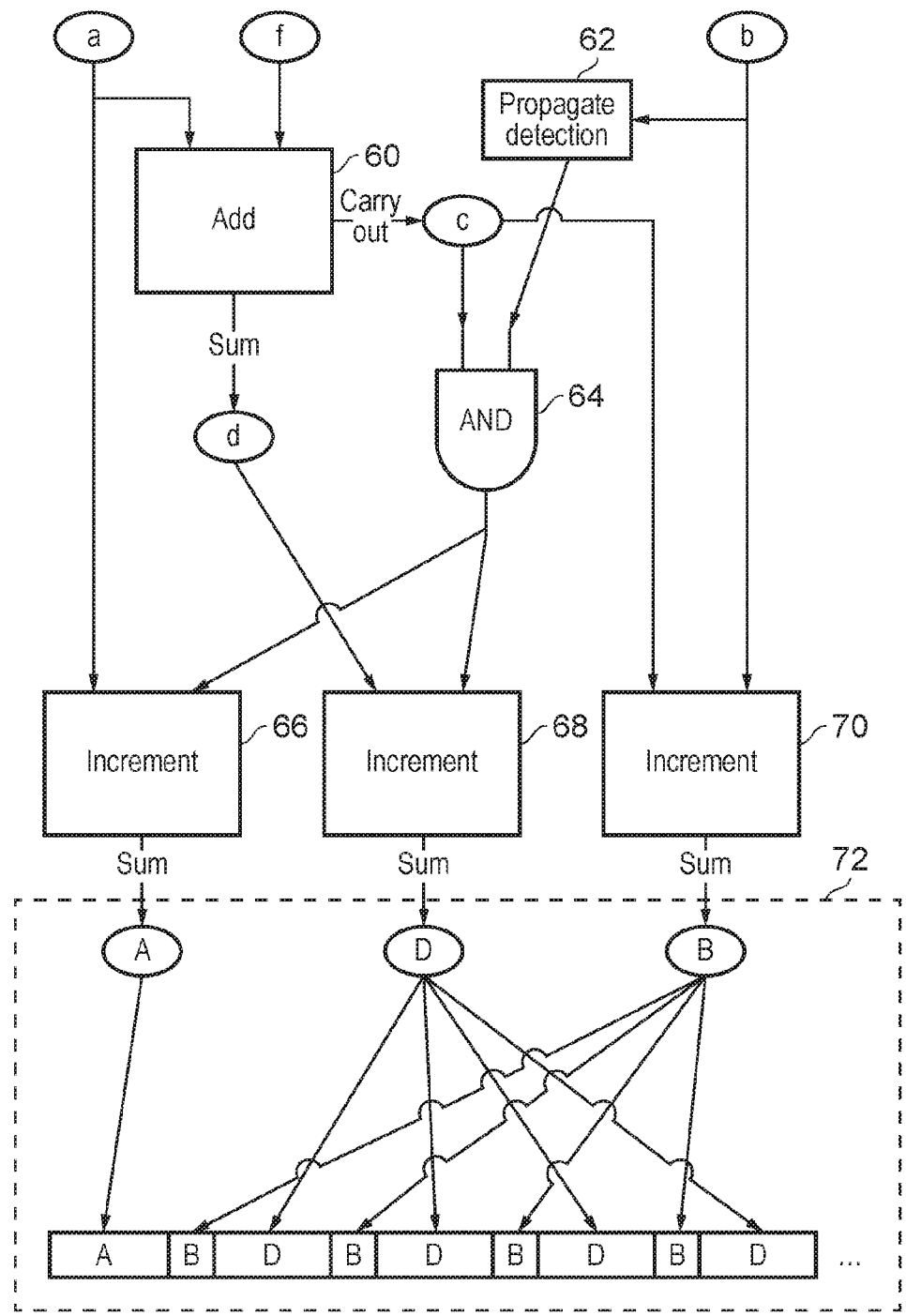
FIG. 5 schematically illustrates components and interconnections of an apparatus in one embodiment which implements the stages shown in FIG. 4.

FIG. 5 schematically illustrates a configuration of the data processing apparatus 10 to implement the stages discussed with respect to FIG. 4. The same style of abbreviated notation is used here, where "a" in FIG. 5 corresponds to the overlapping integer portion in FIG. 4, "b" in FIG. 5 corresponds to the non-overlapping integer portion in FIG. 4 and "f" in FIG. 5 corresponds to the fractional portion in FIG. 4. Similarly "A", "B" and "D" in FIG. 5 respectively correspond to AAAAAAAA, BB and DDDDDDDD in FIG. 4. The overlapping integer (a) and fractional (f) portions of the input value are received by the (full) adder 60 which produces the sum value (d) and the carry out result (c), and has a width equal to the size of the overlap (8 bits in this example). The non-overlapping integer portion (b) of the input value is received by the propagation detection circuitry 62, which determines if the bit values of b will propagate a set carry value. The result of this propagation detection and the carry out result (c) provide the inputs to the AND gate 64, the output of which is passed to the incrementers 66 and 68. The first incrementer 66 increments the overlapping integer portion (a) by the AND gate output to generate the sum value A—a first part of the integer portion of the result value. The second incrementer 32 increments the sum value (d) by the AND gate output to generate the sum value D—a first part of at least one fractional portion of the result value. The first incrementer 66 and second incrementer 68 have the same width as the adder 60 corresponding to the size of the overlap (i.e. 8 bits in this example). A third incrementer 70 is provided in this example and increments the non-overlapping integer portion (b) by carry out result (c) to generate the sum value B—a second part of both the integer and fractional portion of the result value. A, B and D are arranged into the result value by the result generator 72.

Figure 6:
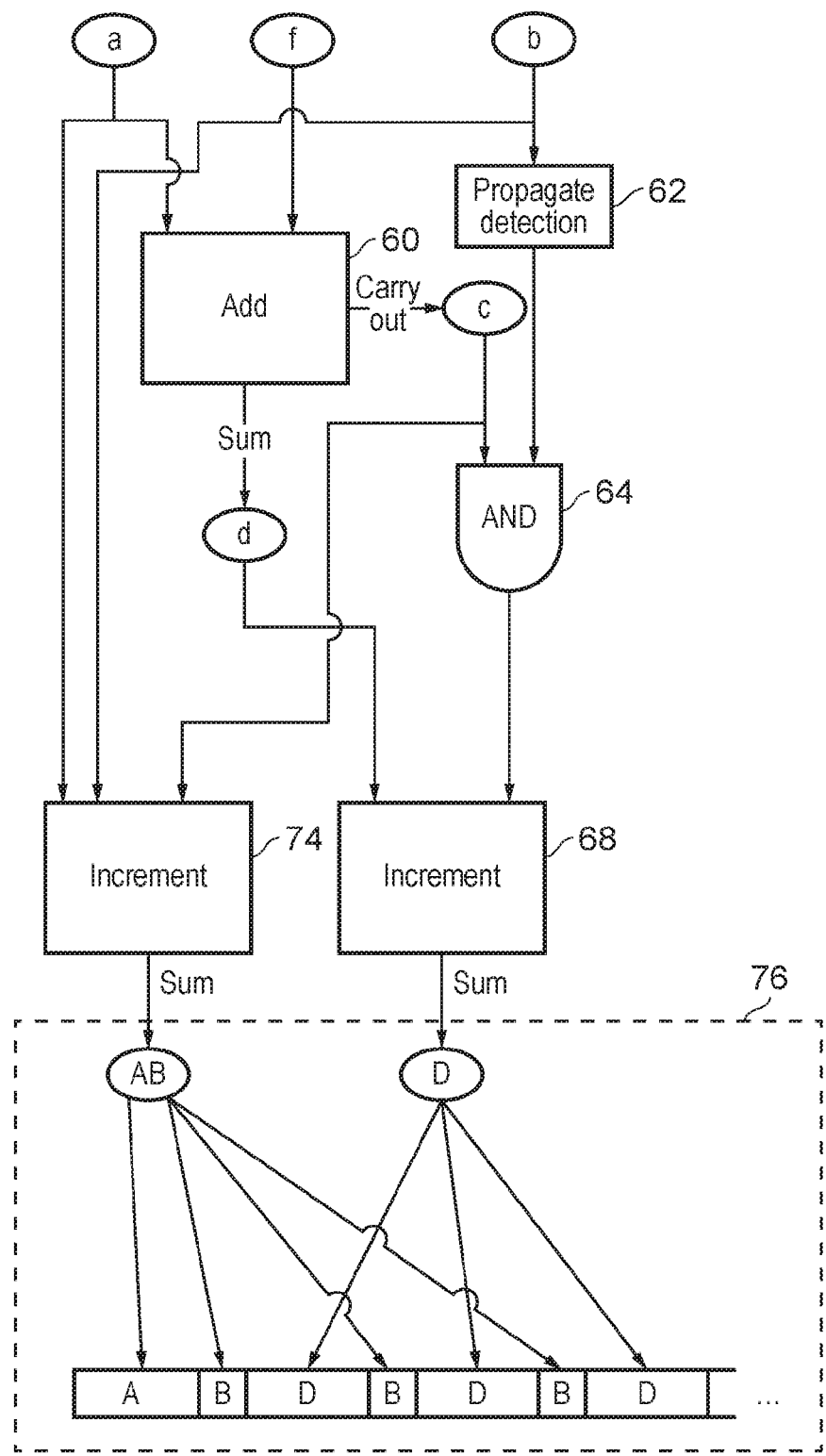
FIG. 6 schematically illustrates components and interconnections of an apparatus in another embodiment which implements the stages shown in FIG. 4.

FIG. 6 schematically illustrates an alternative configuration to the structure shown in FIG. 4, in which the incrementers 66 and 70 have been merged into a single first incrementer 74. The adder 60, propagate detection unit 62, AND gate 64 and second incrementer 68 are themselves unchanged, although the path from the AND gate 64 to the first incrementer 66 has been removed, and the carry out value (c) and the non-overlapping integer part (b) are now provided as inputs to the first incrementer 74. AB (and where required just the B portion) and D are arranged into the result value by the result generator 76. This alternative arrangement is based on the recognition that for the full integer portion of the input value in the example of FIG. 4 (aaaaaaaabb—see box 42), to add the carry value, which as shown in box 48 is done for A=a+(c && propagate(b)) and B=b+c), it is also possible instead do perfrom a combined incrementation of AAAAAAAABB=(aaaaaaaabb)+c. When choosing whether to generate an apparatus according to the configuration shown in FIG. 6 there may be some dependence on how well a synthesis tool can efficiently propagate the carry through b into a (which is generally done well by contemporary synthesis tools). It is noted that if the apparatus is only required to handle a single format, then there is no reason to split these fields, and thus possibly better to merge them. If multiple formats are to be handled in a single unit, it may be of advantage to split them since you need different widths for each in the different formats.

Figure 7:
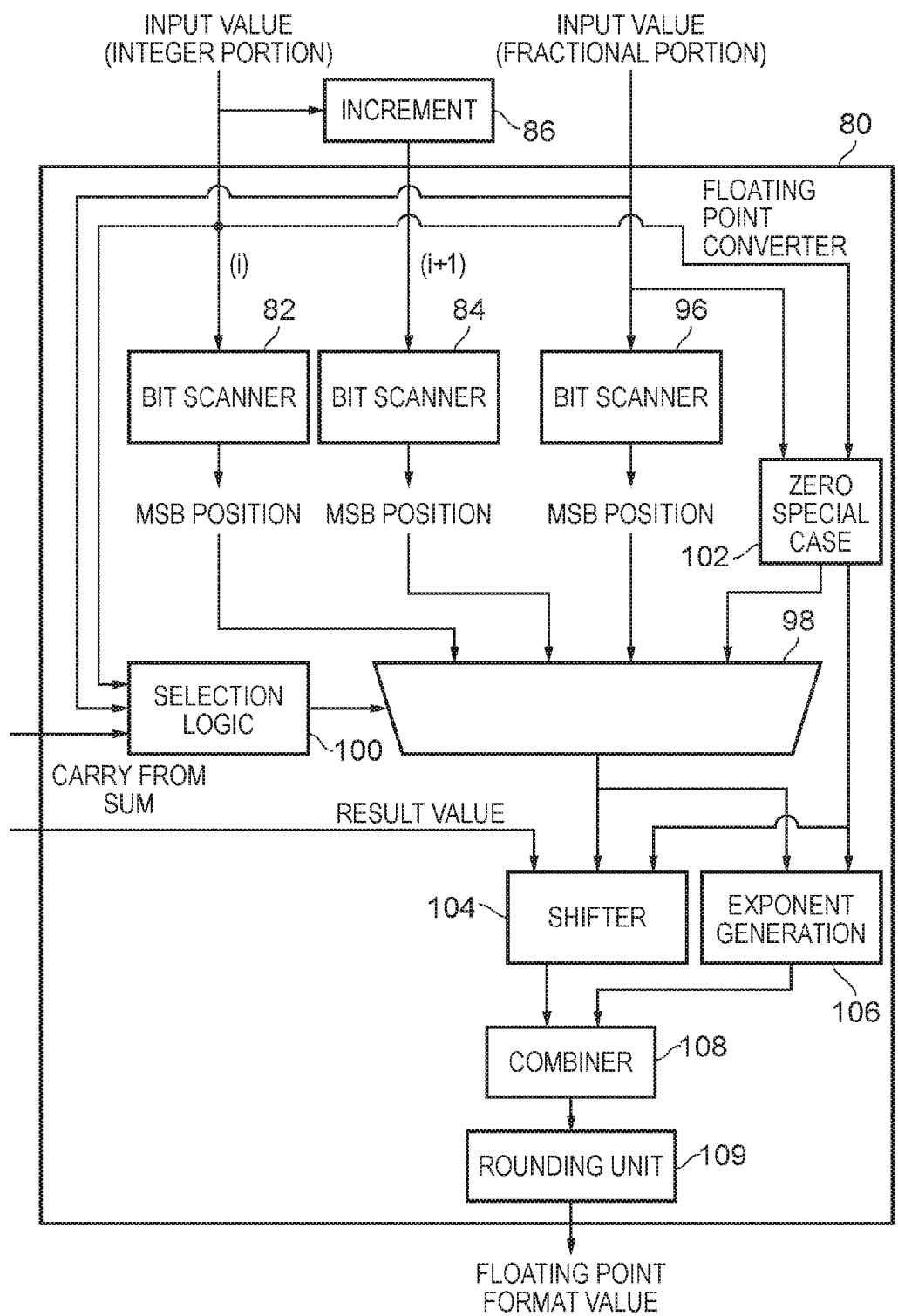
FIG. 7 schematically illustrates components and interconnections of a floating point converter in an apparatus in one embodiment which implements the stages shown in FIG. 4.
Figure 8:
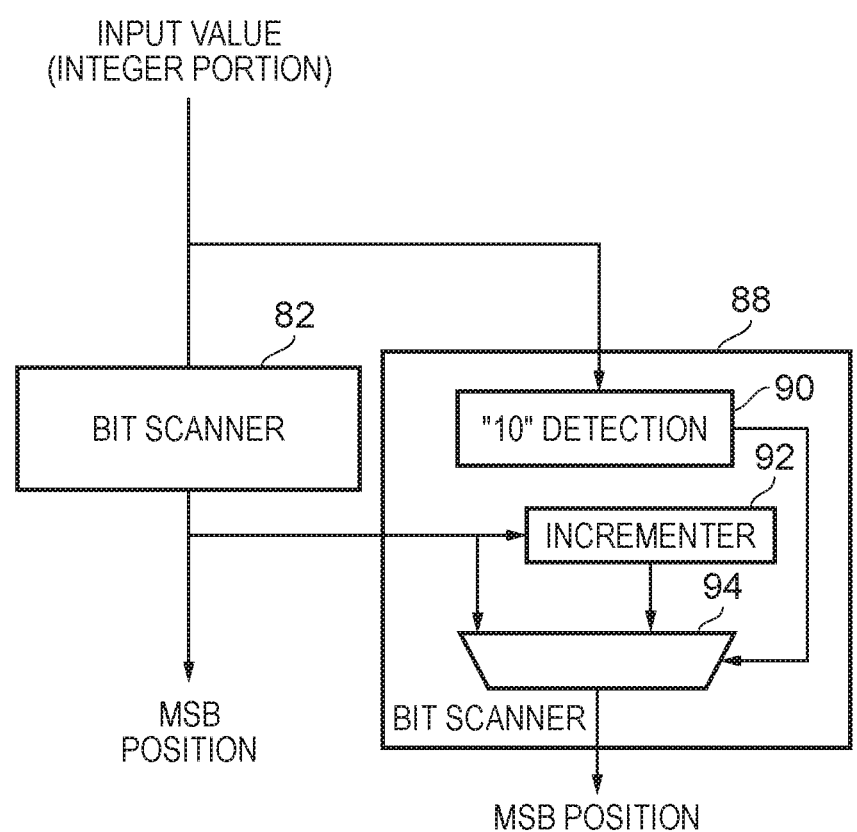
FIG. 8 schematically illustrates an alternative configuration of some of the components and interconnections of the floating point converter shown in FIG. 7.

FIG. 7 schematically illustrates an example of the floating point converter 15 shown in FIG. 1, which may be used to convert the result value generated by the example configurations of the apparatus discussed with reference to FIGS. 2-6. In FIG. 7 the floating point converter is labelled 80. In order to convert the result value into a floating point format, it needs to be scanned to find the most significant set bit, and then the result value needs shifting accordingly to generate the mantissa of the floating point format value. A corresponding exponent value is also generated. The bit scanning is improved by the present techniques using some observations of the calculations described above. There are three cases, and a bit scanner may be provided for each (as is the case in FIG. 7):
  1. If the integer part of the result value is non-zero, and no carry is generated. The primary integer input can then be bit-scanned to generate the shift amount. This is done by the bit scanner 82. The result of the addition(s) is still needed to actually shift, but the bit scanning can be done in parallel to the addition(s).
  2. If the integer part of the result value is non-zero, and a carry is generated. The value (i+1) can be calculated in advance, and this value is then bit scanned. This is done by the bit scanner 84, the incrementer 86. Alternatively (as shown in the bit scanner 88 in FIG. 8) the result from case 1 can be used, and it can be checked whether adding 1 to the integer part would change the bit scan result. If the integer part of the primary input contains the bit pattern "10", then adding one to it will not change the bit scan result. If it doesn't then adding one will add one to the bit scan result. This alternative bit scanner 88 thus comprises "10" detection unit 90, and incrementer 92 and the multiplexer 94. The result of the "10" detection controls which input of the multiplexer is output, i.e. the unamended result from the bit scanner 82 or the result from the bit scanner 82 incremented by one. This has a lower logic depth than increment-then-scan. Again, the result of the addition(s) is still needed to actually shift, but the bit scanning can be done in parallel to the addition(s).
  3. The integer part is zero. This removes the actual additions. The primary fractional input can then be scanned (performed by the bit scanner 96), and the shift is performed using only unmodified inputs. There is also some special casing for zero on this path.

Where these three cases are implemented in parallel (as is the case in FIGS. 7 and 8), there is no logic path from the (i+f) or (a+f) additions to the bit scanner(s), which decreases the logic depth of the entire circuit. It should be noted that it is not necessary for the input value to have both an integer portion and a fractional portion for the floating point converter 80 to be able to generate a floating point format output value, and thus in a case where the input value is only an integer the path via the bit scanner 96 may instead be used for a latter portion of the integer. For example where the input value is an (n+m)-bit integer, the m-bit part may be handled by the bit scanner 96, but of course in this case does not represent a fractional part of the input.

As shown in FIG. 7, the most significant bit positions generated by the respective bit scanners are selected between by the multiplexer 98 under the control of the selection logic 100. The selection logic 100 receives the integer portion of the input value (in order to determine whether it is zero or non-zero) as well as the fractional portion of the input value, for the special case in which both the integer portion and fraction portion are zero. For the special case where both the integer portion and fraction portion zero, zero special case unit 102 is provided, which can provide specially selected values to the shifter 104 (via the multiplexer 98) and the exponent generation unit 106, these specially selected values being used to indicate the "all zero" special case in the output. The selection logic 100 also receives the carry from the sum stage to be able to select between the results from bit scanners 82 and 84. The result value from the result generator 13 (in whichever of the above described configurations it may take) is received by the shifter 104, which shifts this value by the appropriate amount in dependence on the most significant bit (MSB) position received from the multiplexer 98. For the zero special case the zero special case unit 102 may provide the shifter 104 with a replacement value for the result value, as necessary to generate the specially selected value being used to indicate this zero special case. The output of the multiplexer 98 (and an appropriate signal from the zero special casing 102) are received by the exponent generation unit 106. The outputs of the shifter 104 and exponent generation unit 106 are received by the combiner 108 which put these together into the floating point format output value. This floating point format output value may be rounded by the rounding unit 109, for example by rounding the complete floating point number so that it overflows into the exponent (i.e. without having to treat the exponent separately) To give an example of this: starting with a normalized number 1.0, the infinite sum in binary form is 0.1111 . . . , which in normalized form becomes 1.1111 . . . *$2^{-1}$, where the leading 1 isn't stored. Adding 1 to this representation gives 10.0000*$2^{-1}$=1.0*$2^0$. In a representation which concatenated the exponent and mantissa (i.e. exponent:mantissa, ignoring the mantissa bias normally used in floating point) gives 11111111:11111111 . . . +1=00000000:00000000, which gives exactly this effect of changing the exponent from −1 to 0, without having to treat the exponent separately.

Note that in another configuration multiple shifters may be provided, in which case the multiplexer 98 is then provided after these multiple shifters. This allows each shifter to handle a smaller shift amount (e.g. each handling a maximum shift of 8 bits, versus a maximum shift of 16 bits by a single shifter; this reduces overall logic depth). In this case the shifter following bit scanner 96 can use the fractional part of the primary input as the value to shift. For the all-zero case, no shifting is required.

Finally note with respect to the various configurations discussed above with respect to FIGS. 1-8, that if different bit widths are supported in the same converter, then the widths of the values passed between the components will change, and some additional multiplexers can be used to align data properly at the input to each component where the input size can vary. Note that the adder stays the size of the biggest overlap.

Turning now to FIGS. 9 to 12, an example is presented (for an unorm6.8 input value) in which there is a double overlap in the repeating iterative sum, i.e. there are places where 3 bits need to be added. The structure of the repeating iterative sum is shown in box 120 in FIG. 9. As a consequence the "flattening" of the calculation of the present techniques is done in two stages for this example, firstly using the technique from the single overlap case to flatten the fractional bits, and then using the same technique again to flatten the sum totally. In this example the input is being divided by a constant value which is $(2^6-1)$ 63.

To distinguish between the fraction parts of the input value which are involved in 2-bit addition and 3-bit addition, the terms a (for the more significant 3-bit addition-involved part), b (for the intermediate 2-bit addition-involved part) and c (for the less significant 3-bit addition-involved part) are substituted, as shown in box 122. Note that therefore in this example the term c does not refer to the carry out of the addition as previously. In this example, the calculations shown in boxes 44 and 48 of FIG. 4 are generally equivalent to those shown in box 124, with some modifications for this example. These calculations are applied by the present techniques to the repeating iterative sum shown in boxes 120 and 122 in order to carry out the "pre-flattening" operation to "flatten" the fractional bits and leave only a single layer of overlap in the iterative sum as shown in box 126. The above mentioned modifications for this example are that the fractional rather than integer part is under consideration at these stages (with consequent change of inputs to the calculations of d, A, B and D) and the introduction of the additional calculation of the term G. As shown in box 126, G is an overall carry term, representing the overall carry value passed from the fractional portion into the initial (non-overlapping) integer part (iiiiii).

Some observations with respect to the pre-flattened iterative sum shown in box 126 (with terms substituted by those calculated in box 124 and where again an abbreviated notation is used in which (AB) means the "AABBBB" term shown in box 126, and (i+AB)/(i+DB) mean the sum of AABBBB and iiiiii/the sum of DDBBBB and iiiii shown in box 126) are that:
1. If (AB) were to propagate a carry (i.e. G is non-zero), then AB must be zero as a result of that propagation; adding i and G will then not generate a carry;
2. If (AB) is zero, then a carry from (i+DB) would only propagate through the (i+AB) sum if the integer term iiiiii is all ones. This cannot happen for this particular case, in which the above-mentioned representation is used in which the maximum value of 1.0 for a unorm value is given by the integer bits being all ones and the fractional bits being all zero, and hence the fractional bits must be all zeroes if the integer bits are all-ones;
3. If (AB) is non-zero, then a carry might be generated from (i+AB) or a carry might be propagated through (i+AB) from the (i+DB) sum, but not both;
4. In no cases can the overall carry into the first i be more than one.

A further observation is that the carry going into the initial (non-overlapping) integer part (iiiii) can never cause it to gain another bit, since this would only happen if this initial integer section were all ones, but in that case the fractional bits would be all-zeros (again due to the above-mentioned representation for the maximum value of 1.0), and so no carry would be generated. Then the same technique is used again to flatten the sum totally (i.e. from the format shown in box 126 to the format shown in box 130, by means of the calculations/substitutions shown in box 128). The calculations shown in box 128 require two additions to be performed, namely e=(i+AB) and j=(i+DB) (NB: abbreviated notation again). Three incrementing calculations are performed in this example. An incrementing term is generated as the carry out value (generate (i+DB)) from the (i+DB addition) and this is used to increment each of e and j to give E and F respectively. The integer part of the input value (i) is incremented by an increment term which represents the ability for a carry value to be propagated into this integer part of the input value. Note that the ORing of the G term with the remainder of the terms is also based on observation 3 above, related to the above-mentioned representation for the maximum value of 1.0. In the more general case where such representation is not used, the G term would be ADDed with the remainder of the terms. Note that therefore when ORing the G term with the remainder of the terms a new MSB cannot be generated for the integer term, but this is possible when ADDing the G term with the remainder of the terms (and when the integer term is all ones).

The expression in box 126 can thus be substituted for by the expressions shown in box 128, to give the expression shown in box 130 (where it is the FFFFFF term which infinitely repeats). The expression shown in box 130 is thus a fully flattened calculation which implements the repeating iterative sum shown in box 120. As in the previous examples, the data processing apparatus evaluates the expression of box 130 to the required precision for the result, i.e. truncating the expression at the point at which such required precision in the result value is achieved. A rounding of the result value may also be performed by the rounding unit 16 in the result generator 13.

Figure 10:
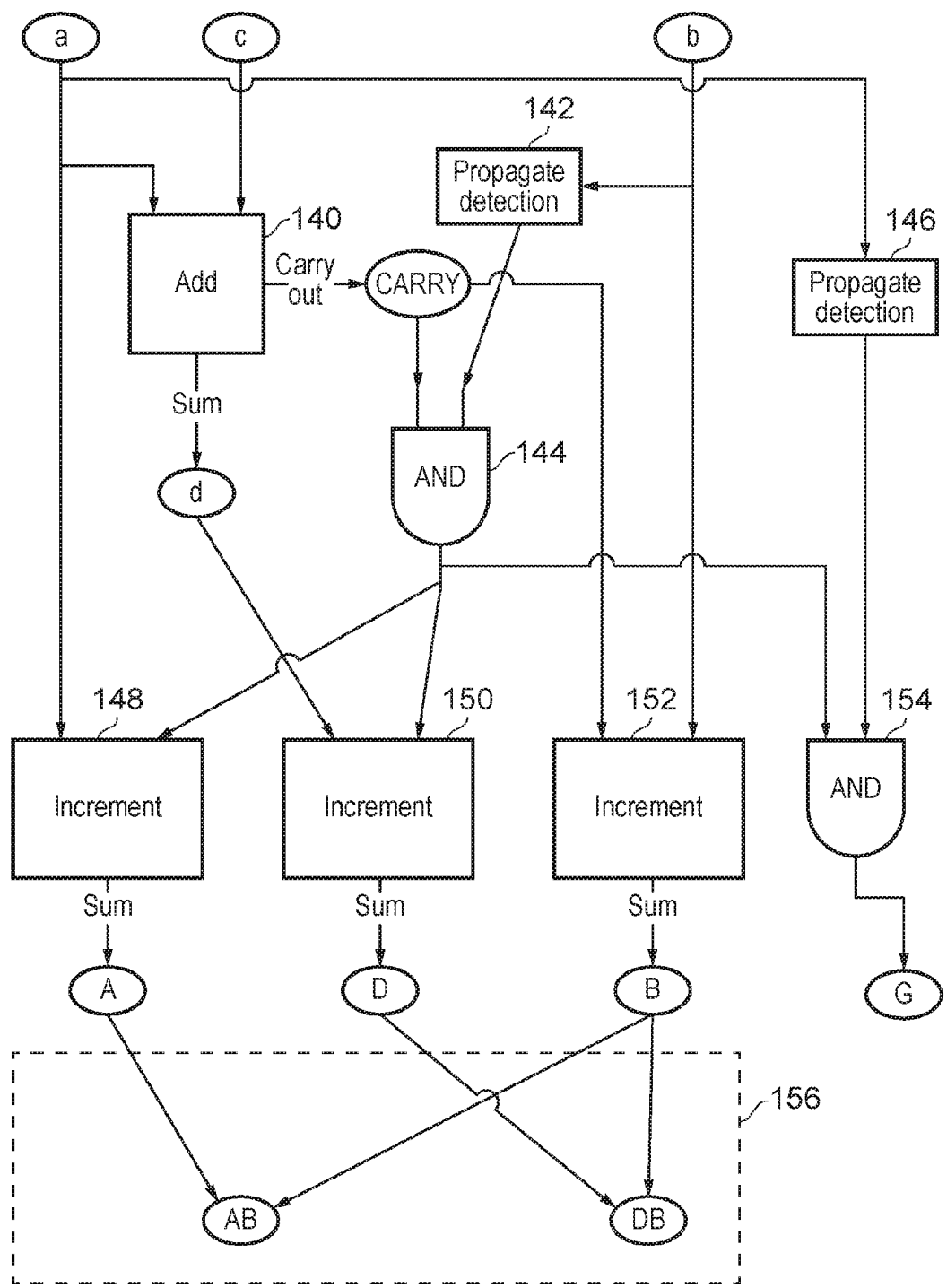
FIG. 10 schematically illustrates components and interconnections of an apparatus in one embodiment which implement the earlier stages shown in FIG. 9 which reduce the double overlap to a single overlap.
Figure 11:
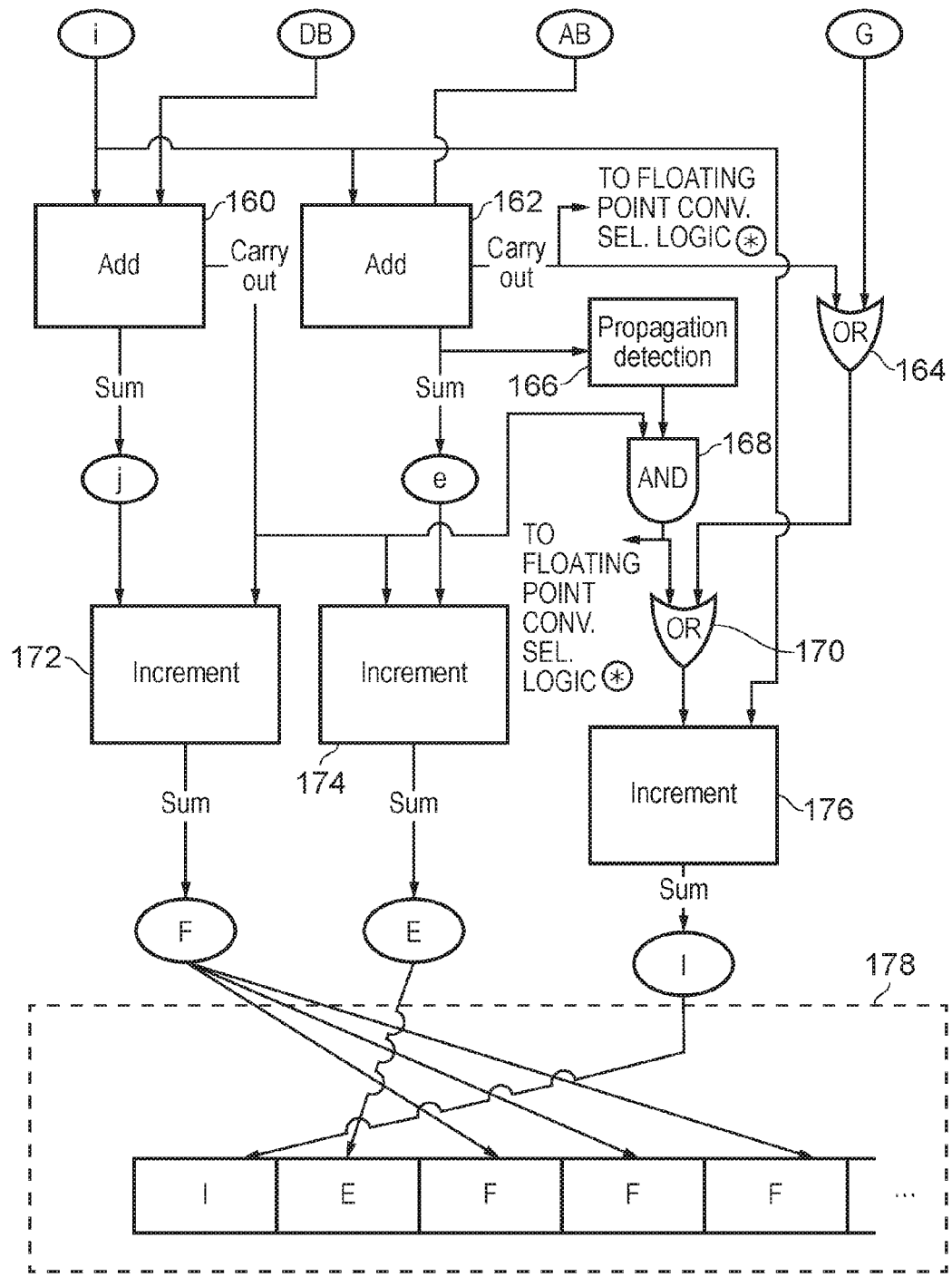
FIG. 11 schematically illustrates components and interconnections of an apparatus in one embodiment which implement the later stages shown in FIG. 9 which determine the result the result of the repeating iterative sum to a required precision.

FIGS. 10 and 11 schematically illustrates a configuration of the data processing apparatus 10 to implement the stages discussed with respect to FIG. 9. Again, the same style of abbreviated notation is used here, where "a" in FIG. 10 corresponds to the aa term in FIG. 9, and so on. Referring to FIG. 10, which corresponds to the calculations of box 124, the a and c portions of the input value are received by the (full) adder 140 which produces the sum value (d) and the carry out result. The adder 140 is thus only required to have a width equal to the size of the overlap between the two at this stage (2 bits in this example), but this adder may be reused for a later stage (see FIG. 11) where a wider width (6 bits in this example) is required to perform the (i+AB) or (i+DB) additions and hence adder 140 may have the width required at that later stage so that it can be reused there. The b portion of the input value is received by the propagation detection circuitry 142, which determines if the bit values of b will propagate a set carry value. The result of this propagation detection and the carry out result from adder 140 provide the inputs to the AND gate 64, the output of which is passed to the incrementers 148 and 150. The a term is also received by the further propagate detection circuitry 146, which determines if the bit values of a will propagate a set carry value. The first incrementer 148 increments the a term by the AND gate 144 output to generate the sum value A. The second incrementer 150 increments the sum value d by the AND gate 144 output to generate the sum value D. The third incrementer 152 increments the b term by carry output from the adder 140 to generate the sum value B. The AND gate 154 has inputs from the AND gate 144 and the propagate detection circuitry 146 to generate the G value. As above, the incrementers 148, 150 and 152 need only have the same width as the their respective inputs at this stage, but may be reused at a further stage (see FIG. 11) and in that case have the largest width required for their role in either stage. A, B and D may be arranged into intermediate result values AB and DB by the result generator 156, but may also be taken directly into the next stage (see FIG. 11) without any explicit rearrangement and fed into the required inputs as parallel bit sets.

Now turning to FIG. 11, which corresponds to the calculations of box 128, the i and DB terms are received by the (full) adder 160 which produces the sum value (j) and the carry out result. The i and AB terms are received by the (full) adder 162 which produces the sum value (e) and the carry out result. As mentioned above, one of these adders may in fact be the same as adder 140, being reused at this stage, and this configuration corresponds to the feedback path shown in FIG. 1 where the output of the result generator 13 is passed back to the input of the full adder(s) 11, thus forming a replacement input value. The G term is received by the OR gate 164. Note that in the more general case mentioned above with regard to the usage of the G term, both the OR gate 164 and the OR gate 170 are each replaced by an ADD gate. This corresponds to the definition of the "I" term in box 128 of FIG. 9 being substituted by I=i+(G+generate(+AB)+ (generate(+DB) && propagate(i+AB))).

The carry output of the adder 162 provides the other input the OR gate 164. The sum output of the adder 162 (e) provides the input to the propagation detection circuitry 166, which determines if the bit values of (e) will propagate a set carry value. The result of this propagation detection and the carry out result from adder 160 provide the inputs to the AND gate 168, the output of which is provides one input to the OR gate 170. Note that the output of AND gate 168 and the carry output of the adder 162 are also passed to the floating point selection logic of FIG. 12 (discussed below). The first incrementer 172 increments the j term by the carry output of adder 160 to generate the sum value F. The second incrementer 174 increments the e term by the carry output of adder 160 to generate the sum value E. The third incrementer 176 increments the i term by the output of the OR gate 170 to generate the sum value I. I, E and F are arranged into the final result value by the result generator 178.

Figure 12:
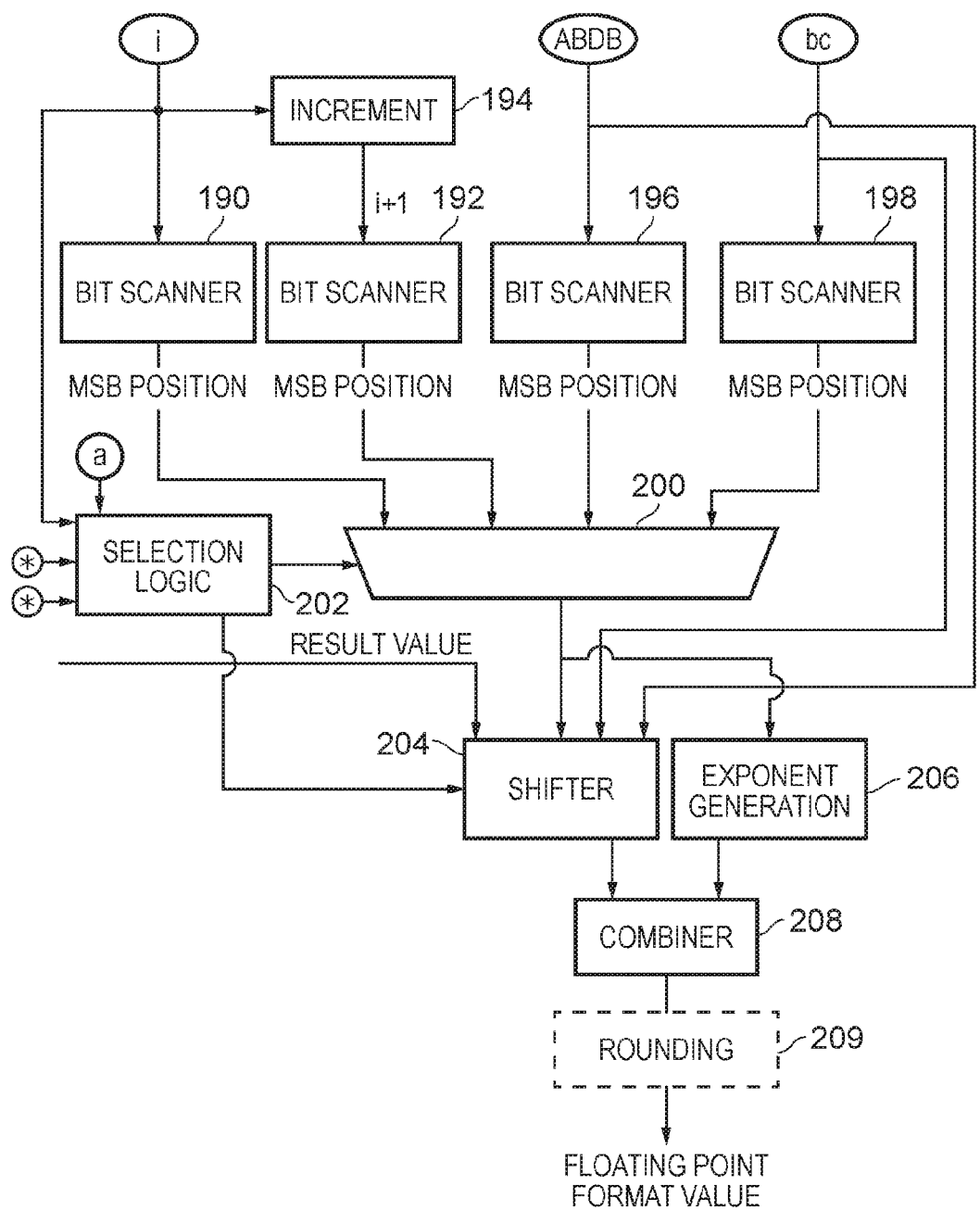
FIG. 12 schematically illustrates components and interconnections of a floating point converter in an apparatus in one embodiment which implements the stages shown in FIG. 9.

FIG. 12 schematically illustrates an example of the floating point converter 15 shown in FIG. 1, which may be used to convert the result value generated by the example configurations of the apparatus discussed with reference to FIGS. 9-11. As before in order to convert the result value into a floating point format, it needs to be scanned to find the most significant set bit, and then the result value needs shifting accordingly to generate the mantissa of the floating point format value and a corresponding exponent value is also generated. This bit scanning is also improved by the present techniques using some further observations of the calculations described above with respect to FIGS. 9-11. Here there are four cases, and a bit scanner may be provided for each (as is the case in FIG. 12):

1. If the integer part of the result value is non-zero, and no carry propagates into it, then as in the FIG. 7 example the primary integer input can be bit-scanned to generate the shift amount. This is done by the bit scanner 190. The result of the additions is still needed to actually shift, but the bit scanning can be done in parallel to those additions.
2. If the integer part of the result value is non-zero, and a carry propagates into it, then as in the FIGS. 7 and 8 examples the same two possibilities exist, namely either to bit scan the primary integer input plus one, or detect if the case 1 result is affected by the carry. Only the first example is shown here, as implemented by the bit scanner 192 and the incrementer 194.
3. If the integer part is zero, and a is non-zero, then the result of flattening the carry (ABDB), i.e. the full fractional part, can be bit scanned and this term is also use this for shifting, since the final addition with the integer part will have no effect since it is zero. This is implemented by the bit scanner 196 and the path taking the ABDB term to the shifter 204.
4. If the integer part is zero, and a is zero then the primary input bc can be bit scanned and also used for the shifting. Since no additions have any effect, this can be done in parallel with everything else. This is implemented by the bit scanner 198 and the path taking the bc term to the shifter 204.

It is again the case that where these four cases are implemented in parallel (as is the case in FIG. 12), there is no logic path from the (i+AB) or (i+DB) additions to the bit scanner(s), which decreases the logic depth of the entire circuit. As shown in FIG. 12, the most significant bit positions generated by the respective bit scanners are selected between by the multiplexer 200 under the control of the selection logic 202. The selection logic 202 receives the i term, a term, and (see FIG. 11) the output of AND gate 168 and the carry output of the adder 162 as inputs, so that it can select between the four cases described above. The result value from the result generator 178, as well as the terms ABDB and bc for cases 3 and 4, are received by the shifter 204 which shifts the appropriate value (as signaled by the section logic 202) by the appropriate amount in dependence on the most significant bit (MSB) position received from the multiplexer 200. The output of the multiplexer 200 is received by the exponent generation unit 206. The outputs of the shifter 204 and exponent generation unit 206 are received by the combiner 208 which put these together into the floating point format output value. A rounding unit 209 may also be provided, as described above with respect to unit 109 in FIG. 7. Similarly, as also described above with respect to FIG. 7, in a variant multiple shifters may be provided before the multiplexer 200 instead of the single shifter 204, allowing for each shifter to handle a smaller shift amount.

Figures 13A, 13B:
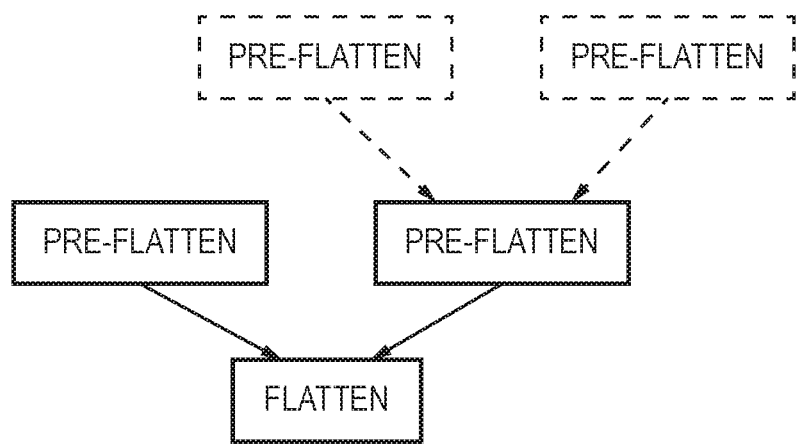
FIG. 13A shows a repeating iterative sum having a triple overlap between the integer and fractional portions of an input value.
FIG. 13B shows the use of more than one pre-flattening procedure to reduce multiple levels of overlap in a repeating iterative sum to a snivel level of overlap.

FIG. 13A shows an example in which there is a triple overlap in the repeating iterative sum, i.e. there are places where 4 bits need to be added. As a consequence the "flattening" of the calculation of the present techniques is done in multiple stages for this example, using the single overlap technique to separately flatten one level of fractional bits overlap, and for one level of integer/fractional overlap. Then the same technique can be used again to completely flatten the iterative sum. These multiple stages may be implemented at least partially in parallel as shown in FIG. 13B, where a tree structure is used to perform multiple flattenings and bring their results together. The present techniques may even be applied to more than a triple overlap as the additional (dashed box) pre-flatten stages in FIG. 13B show. However it is recognized that the increasing implementational cost of such multiple flattenings is to be balanced against the alternative of converting the inputs to a larger format before seeking to perform the required division, which at some point may be considered a more efficient approach (in depending on the frequency of usage of the respective formats and the circuit area required for each approach).

Figure 14:
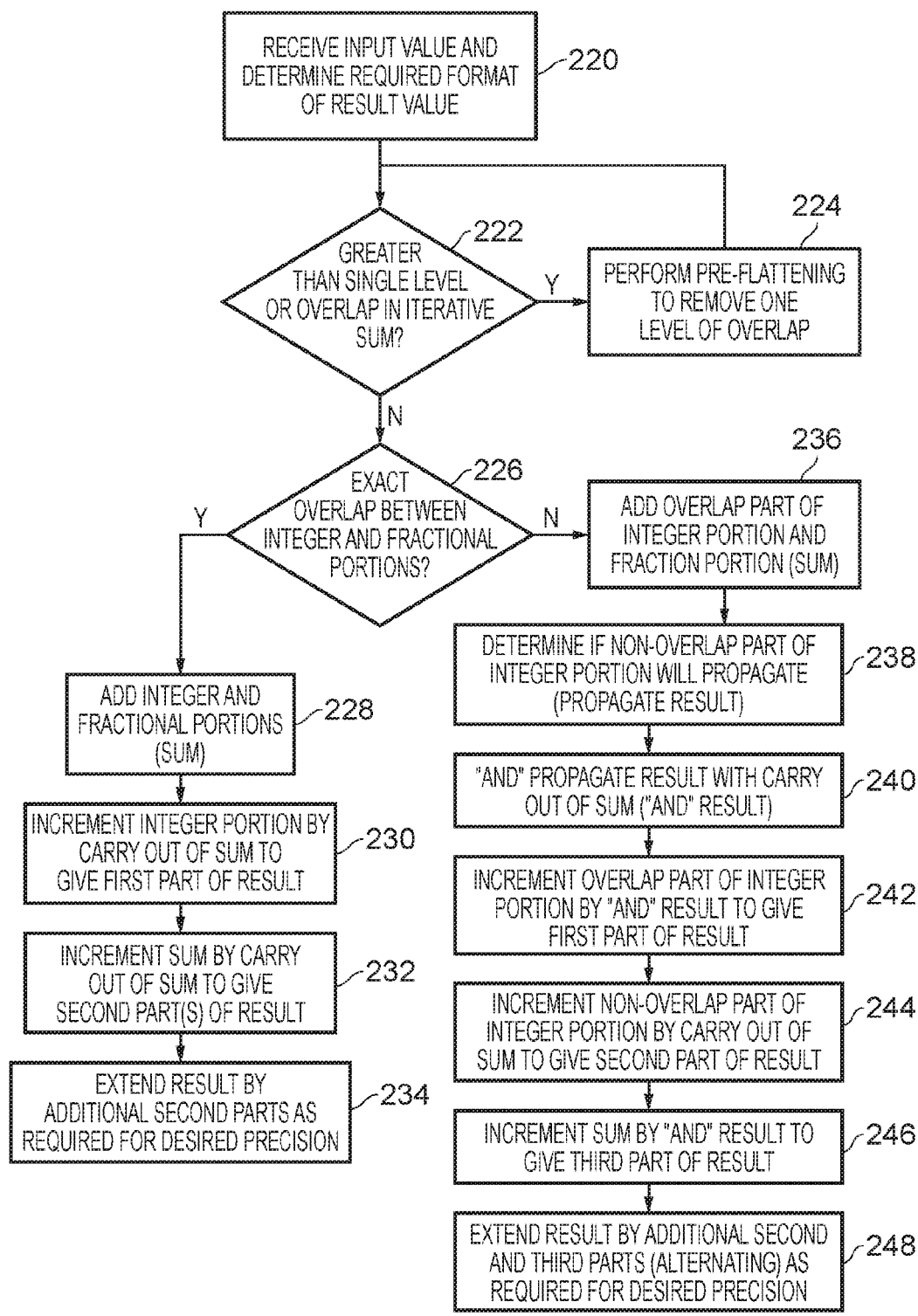
FIG. 14 shows a sequence of steps which are taken in a method of one embodiment.

FIG. 14 shows a sequence of steps which are taken in the method of one embodiment. The flow begins at step 220 where the input value is received and it is determined what the required format of the result value is. Then, at step 222, it is determined if there is more than a single level of overlap the repeating iterative sum. If there is, then the flow proceeds to step 224, where a pre-flattening operation is performed to remove one level of overlap. The flow then returns to step 222 to determine if this has resulted in only a single level of overlap remaining in the iterative sum, with the possibility of returning to step 224 as many times as necessary until only a single level of overlap remains. Once only a single level of overlap remains then at step 226 it is determined if there is exact overlap between the integer and fractional portions of the input value (or the replacement input value if step 224 has been used at least once). If the overlap between these portions is exact then the flow proceeds to step 228 where the integer and fractional portions are added to produce a sum value. Then, at step 230, the integer portion is incremented by the carry output of the sum operation to give the first part of the result value. Then at step 232 the sum is incremented by the carry output of the sum operation to give the second part(s) of the result value. Note that the increment steps 230 and 232 do not need to be carried out sequentially and, as is illustrated in FIG. 3 can indeed be carried out in parallel. Finally, at step 234 the result value is extended by as many additional second parts as required to produce the result value with the desired precision.

Returning to a consideration of step 226, if the overlap between the integer and fractional portions is non-exact then the flow proceeds to step 236 where the overlap part of the integer portion and the fractional portion are added to give a sum value. Then at step 238 it is determined if the non-overlapping part of the integer portion will propagate, this being represented by a propagate result. Then at step 240 this propagate result is ANDed with the carry output of the sum operation and at step 242 the overlapping part of the integer portion is incremented by the AND result (of step 240) to give the first part of the result value. Then at step 244 the non-overlapping integer portion is incremented by the carry output of the sum operation to give the second part of the result value. At step 246 the sum value is incremented by the AND result to give the third part of the result value. As before it is to be noted that steps 242, 244 and 246 do not need to be carried out sequentially and as illustrated in FIG. 5 can indeed be carried out in parallel. Finally at step 248 the result value is extended by as many additional second and third parts (alternating) as required to give a result value of the desired precision.

Figure 15:
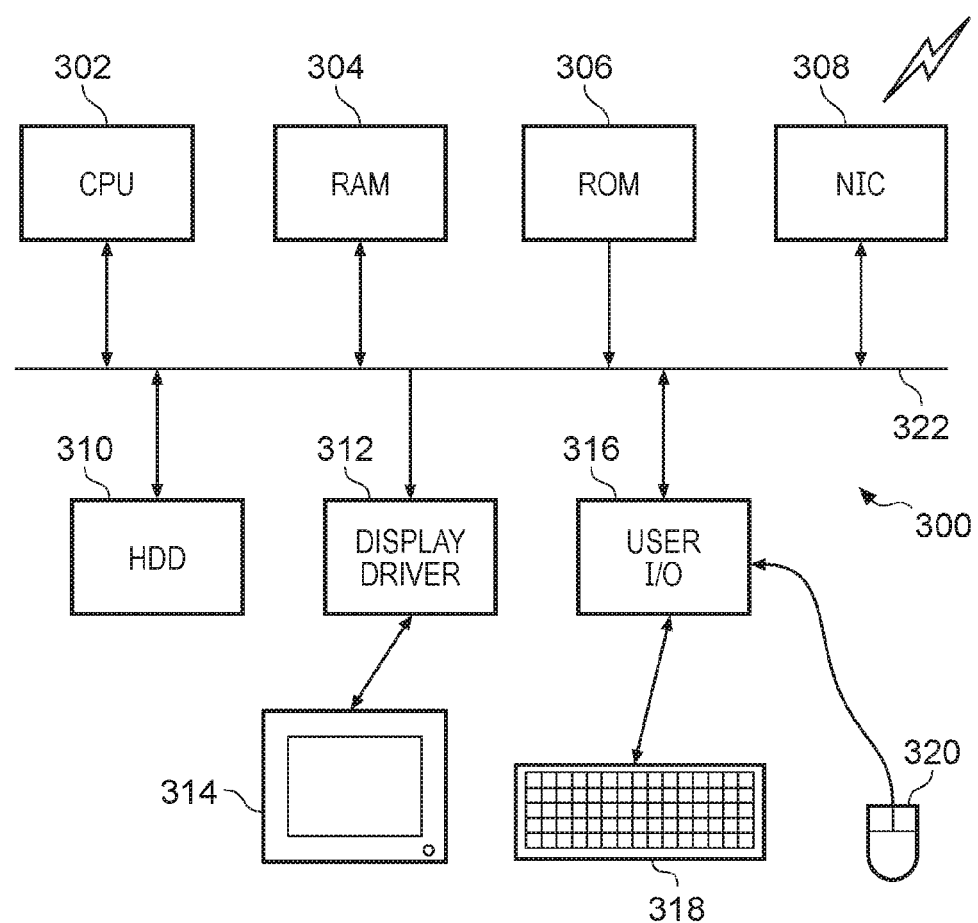
FIG. 15 schematically illustrates a general purpose computing apparatus which is controlled by program instructions to carry out the method of one embodiment.

FIG. 15 schematically illustrates a general purpose computing device 300 of the type that may be used to implement the above described techniques. The general purpose computing device 300 includes a central processing unit 302, a random access memory 304 and a read only memory 306, connected together via bus 322. It also further comprises a network interface card 308, a hard disk drive 310, a display driver 312, a monitor 314 and a user input/output circuit 316 with a keyboard 318 and mouse 320 all connected via the common bus 322. In operation the central processing unit 302 will execute computer program instructions that may for example be stored in the random access memory 304 and/or the read only memory 306. Computer program instructions could be additionally retrieved from the hard disk drive 310 or dynamically downloaded via the network interface card 308. The RAM 304, the ROM 306, the hard disk drive 310 and any storage medium accessed via the network interface card 308 thus each represent a computer-readable storage medium on which a computer program is stored in a non-transient fashion. The results of the processing performed may be displayed to a user via the display driver 312 and monitor 314. User inputs for controlling the operation of the general purpose computing device 300 may be received via the user input output circuit 316 from the keyboard 318 or the mouse 320. It will be appreciated that the computer program could be written in a variety of different computer languages. The computer program may be stored locally on a recording medium or dynamically downloaded to the general purpose computing device 300. When operating under control of an appropriate computer program, the general purpose computing device 300 can perform the above described techniques and can be considered to form an apparatus for performing the above described techniques. The architecture of the general purpose computing device 300 could vary considerably and FIG. 15 is only one example.

Thus in overall summary an apparatus, method and program are provided for calculating a result value to a required precision of a repeating iterative sum, wherein the repeating iterative sum comprises multiple iterations of an addition using an input value. Addition is performed in a single iteration of addition as a sum operation using overlapping portions of the input value and a shifted version of the input value, wherein the shifted version of the input value has a partial overlap with the input value. At least one result portion is produced by incrementing an input derived from the input value using the output from the sum operation and the result value is constructed using the at least one result portion to give the result value to the required precision. The repeating iterative sum is thereby flattened into a flattened calculation which requires only a single iteration of addition using the input value, thus facilitating the calculation of the result value of the repeating iterative sum.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:
1. Apparatus for calculating a result value to a required precision of a repeating iterative sum, wherein the repeating iterative sum comprises multiple iterations of an addition using an input value, wherein the apparatus comprises:
  an adder capable of performing a single iteration of addition as a sum operation using overlapping portions of the input value and a shifted version of the input value, wherein the shifted version of the input value has a partial overlap with the input value;
  at least one incrementer capable of producing at least one result portion derived from the input value using output from the sum operation performed by the adder; and
  a result generator capable of constructing the result value using the at least one result portion to give the result value to the required precision,
  wherein:
  the adder is capable of performing the sum operation to produce a sum value;
  the at least one incrementer comprises:

a first incrementer capable of producing a first result portion, wherein producing the first result portion comprises incrementing a most significant portion of the input value which has the partial overlap with the shifted version of the input value using a carry result of the sum operation; and a second incrementer capable of producing a second result portion, wherein producing the second result portion comprises incrementing the sum value using the carry result of the sum operation; and the result generator is capable of constructing the result value as the first result portion followed by at least one second result portion to give the result value to the required precision.

2. The apparatus as claimed in claim 1, wherein a first iteration of the addition comprises addition of the input value to the shifted version of the input value, and wherein each further iteration of the addition comprises addition of a previous iteration addition result to a further shifted version of the input value, wherein the further shifted version of the input value has the partial overlap with the previous iteration addition result.

3. The apparatus as claimed in claim 1,
wherein an intermediate portion of the input value has no overlap with the shifted version of the input value,
wherein the first incrementer is capable of producing the first result portion as the most significant portion of the input value which has the partial overlap incremented by an increment value, wherein the increment value is given by the carry result of the sum operation ANDed with a propagate value, wherein the propagate value indicates whether the intermediate portion will carry-propagate in the addition,
the second incrementer is capable of producing the second result portion as the sum value incremented by the increment value,
and the result generator is capable of constructing the result value in which both the first result portion and the second result portion are suffixed by the third result portion.

4. The apparatus as claimed in claim 3, wherein the apparatus further comprises:
a third incrementer capable of producing a third result portion, wherein producing the third result portion comprises incrementing the intermediate portion by the carry result of the sum operation.

5. The apparatus as claimed in claim 1, further comprising:
a floating point converter capable of converting the result value into a floating point format value.

6. The apparatus as claimed in claim 1, wherein the input value comprises an integer portion and a fraction portion.

7. The apparatus as claimed in claim 6, further comprising:
a floating point converter capable of converting the result value into a floating point format value;
wherein the floating point converter comprises:
a first bit position generator capable of receiving the integer portion of the input value and outputting a most significant bit position as a first bit position output value; and
a second bit position generator capable of outputting a most significant bit position of the integer portion of the input value incremented by one as a second bit position output value; and a third bit position generator capable of generating a position of a most significant bit in the fraction portion of the input value as a third bit position output value, wherein the floating point converter is capable of generating an exponent portion of the floating point format value using the first bit position output value when the integer portion is non-zero and the carry result is zero, using the second bit position output value when the integer portion is non-zero and the carry result is non-zero, and using the third bit position output value when the integer portion is zero.

8. The apparatus as claimed in claim 7, wherein the second bit position generator is capable of determining whether the integer portion of the input value comprises a one immediately followed by a zero, and if it does providing the first bit position output value as the second bit position output value, and if it doesn't incrementing the first bit position output value by one to generate the second bit position output value.

9. The apparatus as claimed in claim 8 wherein an intermediate portion of the input value has no overlap with the shifted version of the input value, and wherein:
the adder is capable of performing the sum operation to produce a sum value;
the at least one incrementer comprises:
a first incrementer capable of producing a first result portion, wherein producing the first result portion comprises suffixing a most significant portion of the input value which has the partial overlap with the intermediate portion of the input value to give an first result portion input value, and incrementing the first result portion input value with a carry result of the sum operation; and
a second incrementer capable of producing a second result portion, wherein producing the second result portion comprises incrementing the sum value using the carry result of the sum operation; and
the result generator is capable of constructing the result value as the first result portion followed by at least one second result portion to give the result value to the required precision, wherein the at least second one result portion is suffixed by a least significant portion of the first result value having a same size as the intermediate portion of the input value;
wherein, when the most significant portion of the fraction portion is zero, the third bit position generator is capable of generating the position of the most significant bit in the fraction portion of the input value as the third bit position output value using a replacement fraction portion, the replacement fraction portion comprising:
the intermediate significance portion of the fraction portion suffixed by the least significant portion of the fraction portion.

10. The apparatus as claimed in claim 7, wherein the first bit position generator, the second bit position generator, and the third bit position generator are capable of parallel operation.

11. The apparatus as claimed in claim 7, wherein the partial overlap comprises a double self-overlap of the input value in the repeating iterative sum, the double self-overlap comprising addition of a least significant portion of the input value, an intermediate significance portion of the input value and a most significant portion of the input value in a first iteration of the repeating iterative sum, and the apparatus is capable of performing a pre-flattening operation of removing the double self-overlap for the input value in the repeating iterative sum comprising determining a replacement input value for the input value;

wherein, when the most significant portion of the fraction portion is non-zero, the third bit position generator is capable of generating the position of the most significant bit in the fraction portion of the input value as the third bit position output value using a replacement fraction portion, the replacement fraction portion comprising:

the first pre-flatten portion suffixed by the second pre-flatten portion, suffixed by at least one instance of the third pre-flatten portion suffixed by the second pre-flatten portion.

12. The apparatus as claimed in claim 1, wherein the partial overlap comprises a double self-overlap of the input value in the repeating iterative sum, the double self-overlap comprising addition of a least significant portion of the input value, an intermediate significance portion of the input value and a most significant portion of the input value in a first iteration of the repeating iterative sum, and the apparatus is capable of performing a pre-flattening operation of removing the double self-overlap for the input value in the repeating iterative sum comprising determining a replacement input value for the input value.

13. The apparatus as claimed in claim 12, wherein the input value comprises an integer portion and a fraction portion, wherein the intermediate significance portion of the input value is a most significant portion of the fraction portion, wherein the least significant portion of the input value is a least significant portion of the fraction portion, wherein an intermediate significance portion of the fraction portion is not comprised in the double self-overlap, and wherein the apparatus comprises:

a pre-flatten adder capable of performing a pre-flatten sum operation on the most significant portion of the fraction portion and the least significant portion of the fraction portion to produce a pre-flattened sum value;

a first pre-flatten incrementer capable of producing a first pre-flatten portion by incrementing the most significant portion of the fraction portion by a pre-flatten increment value, wherein the pre-flatten increment value is given by a carry result of the pre-flatten sum operation ANDed with a pre-flatten propagate value, wherein the pre-flatten propagate value indicates if the intermediate significance portion of the fraction portion will carry-propagate in the addition, a second pre-flatten incrementer capable of producing a second pre-flatten portion as the intermediate significance portion of the fraction portion incremented by the carry result of the pre-flatten sum operation;

a third pre-flatten incrementer capable of producing a third pre-flatten result portion as the pre-flattened sum value incremented by the pre-flatten increment value; and a pre-flatten generate value generator capable of producing a pre-flatten generate value as the pre-flatten increment value ANDed with an indication of whether the most significant portion of the fraction portion will carry-propagate in the addition, and the apparatus is capable of constructing the replacement input value in a first iteration of the repeating iterative sum by replacing the fraction portion with the first pre-flatten portion suffixed by the second pre-flatten portion, and in a second iteration of the repeating iterative sum by replacing the fraction portion with the third pre-flatten portion suffixed by the second pre-flatten portion and prepending by the pre-flatten generate value, and in third and further iterations of the repeating iterative sum by replacing the fraction portion with the third pre-flatten portion suffixed by second pre-flatten portion.

14. The apparatus as claimed in claim 13, wherein the apparatus comprises:

a first adder capable of performing a first sum operation on the integer portion and the first pre-flatten portion suffixed by the second pre-flatten portion to produce a first sum value;

a second adder capable of performing a second sum operation on the integer portion and the third pre-flatten portion suffixed by the second pre-flatten portion to produce a second sum value;

a first incrementer capable of generating a first result portion by incrementing the first sum value by a carry result of the second sum operation;

a second incrementer capable of generating a second result portion by incrementing the second sum value by the carry result of the second sum operation; and a third incrementer capable of generating a third result portion by incrementing the integer portion by a further pre-flatten increment value.

15. The apparatus as claimed in claim 14, wherein the further pre-flatten increment value is given by the pre-flatten generate value ORed with the carry result of the first sum operation ORed with an increment contribution value, wherein the increment contribution value is given by the carry result of the second sum operation ANDed with a propagate value which indicates if the first sum value will carry-propagate in the addition, and the result generator is capable of constructing the result value as the third result portion followed the first result value portion followed by at least one second result portion to give the result value to the required precision.

16. The apparatus as claimed in claim 14, wherein the further pre-flatten increment value is given by the pre-flatten generate value added to the carry result of the first sum operation added to an increment contribution value, wherein the increment contribution value is given by the carry result of the second sum operation ANDed with a propagate value which indicates if the first sum value will carry-propagate in the addition, and the result generator is capable of constructing the result value as the third result portion followed the first result value portion followed by at least one second result portion to give the result value to the required precision.

17. The apparatus as claimed in claim 12, wherein the partial overlap comprises at least a triple self-overlap of the input value in the repeating iterative sum, the triple self-overlap comprising the double self-overlap and at least one further self-overlap of the input value in the repeating iterative sum, the triple self-overlap corresponding to addition of three incrementally shifted versions of the input value to the input value at the first iteration of the repeating iterative sum, and the apparatus is capable of performing at least one further pre-flattening operation of removing the at least one further self-overlap of the input value in the repeating iterative sum comprising determining a prior replacement input value for the replacement input value.

18. The apparatus as claimed in claim 17, wherein the apparatus is capable of performing a further pre-flattening operation in parallel with the pre-flattening operation.

19. The apparatus as claimed in claim 1, wherein the input value represents a normalised number having a minimum absolute value of zero and a maximum absolute value of one.

20. The apparatus as claimed in claim 19, wherein the input value has an integer component and a fraction component, and wherein to represent the maximum absolute value of the normalised number the integer component is a continuous sequence of a first type of bit value and the fraction component is a continuous sequence of a second type of bit value, wherein the second type is complementary to the first type.

21. The apparatus as claimed in claim 1, wherein the repeating iterative sum implements multiplication by a reciprocal of a non-power-of-two constant.

22. The apparatus as claimed in claim 21, wherein the non-power-of-two constant is expressible as an integer power-of-two minus one.

23. The apparatus as claimed in claim 1, wherein the apparatus is capable of performing a rounding operation on the result value comprising addition of half of a last place unit to the result value.

24. A method of calculating a result value to a required precision of a repeating iterative sum in a data processing apparatus, wherein the repeating iterative sum comprises multiple iterations of an addition using an input value, wherein the method comprises the steps, implemented by the data processing apparatus, of:
performing a single iteration of addition as a sum operation to produce a sum value using overlapping portions of the input value and the shifted version of the input value, wherein the shifted version of the input value has a partial overlap with the input value;
producing by incrementation a first result portion and a second result portion derived from the input value using output from the sum operation, wherein producing the first result portion includes incrementing a most significant portion of the input value which has the partial overlap with the shifted version of the input value using a carry result of the sum operation, and wherein producing the second result portion comprises incrementing the sum value using the carry result of the sum operation; and
constructing the result value using the first result portion followed by at least one second result portion to give the result value to the required precision to give the result value to the required precision.

25. A computer-readable storage medium on which a computer program is stored in a non-transient fashion, the computer program for controlling a computer to carry out the method of claim 24.

26. Apparatus for calculating a result value to a required precision of a repeating iterative sum, wherein the repeating iterative sum comprises multiple iterations of an addition using an input value, wherein the apparatus comprises:
an adder capable of performing a single iteration of addition as a sum operation using overlapping portions of the input value and a shifted version of the input value, wherein the shifted version of the input value has a partial overlap with the input value;
at least one incrementer capable of producing at least one result portion derived from the input value using output from the sum operation performed by the adder; and
a result generator capable of constructing the result value using the at least one result portion to give the result value to the required precision,
wherein an intermediate portion of the input value has no overlap with the shifted version of the input value, and wherein:
the adder is capable of performing the sum operation to produce a sum value;
the at least one incrementer comprises:
a first incrementer capable of producing a first result portion, wherein producing the first result portion comprises suffixing a most significant portion of the input value which has the partial overlap with the intermediate portion of the input value to give an first result portion input value, and incrementing the first result portion input value with a carry result of the sum operation; and
a second incrementer capable of producing a second result portion, wherein producing the second result portion comprises incrementing the sum value using the carry result of the sum operation; and
the result generator is capable of constructing the result value as the first result portion followed by at least one second result portion to give the result value to the required precision, wherein the at least second one result portion is suffixed by a least significant portion of the first result value having a same size as the intermediate portion of the input value.

* * * * *

UNITED STATES PATENT AND TRADEMARK OFFICE
CERTIFICATE OF CORRECTION

PATENT NO. : 9,933,999 B2  
APPLICATION NO. : 14/878562  
DATED : April 3, 2018  
INVENTOR(S) : Engh-Halstvedt et al.

Page 1 of 1

It is certified that error appears in the above-identified patent and that said Letters Patent is hereby corrected as shown below:

On the Title Page

Item (72) Inventors, should read:

--Andreas Due Engh-Halstvedt, Trondheim (NO); Edvard Fielding, Trondheim (NO); Ronny Pedersen, Trondheim (NO)--

Signed and Sealed this  
Tenth Day of July, 2018

Andrei Iancu  
*Director of the United States Patent and Trademark Office*